(12) United States Patent
Hu

(10) Patent No.: US 12,658,799 B2
(45) Date of Patent: Jun. 16, 2026

(54) VOLTAGE REGULATOR WITH BUILT-IN AUTO TEST

(71) Applicant: Hangzhou MPS Semiconductor Technology, Ltd., Hangzhou (CN)

(72) Inventor: Wangmiao Hu, Hangzhou (CN)

(73) Assignee: Hangzhou MPS Semiconductor Technology, Ltd., Hangzhou (CN)

( * ) Notice: Subject to any disclaimer, the term of this patent is extended or adjusted under 35 U.S.C. 154(b) by 173 days.

(21) Appl. No.: 18/608,511

(22) Filed: Mar. 18, 2024

(65) Prior Publication Data

US 2024/0322688 A1 Sep. 26, 2024

(30) Foreign Application Priority Data

Mar. 20, 2023 (CN) .......................... 202310284144.3

(51) Int. Cl.
*H02M 3/158* (2006.01)
*G01R 19/00* (2006.01)

(52) U.S. Cl.
CPC ........ *H02M 3/158* (2013.01); *G01R 19/0038* (2013.01)

(58) Field of Classification Search
CPC .......................... H02M 3/158; G01R 19/0038
See application file for complete search history.

(56) References Cited

U.S. PATENT DOCUMENTS

| | | | | |
|---|---|---|---|---|
| 5,537,030 A | * | 7/1996 | Snodgrass | G01R 31/42 |
| | | | | 324/73.1 |
| 6,735,302 B1 | * | 5/2004 | Caine | H04M 19/005 |
| | | | | 379/404 |
| 8,705,300 B1 | * | 4/2014 | Xu | G11C 29/08 |
| | | | | 365/201 |
| 9,541,973 B2 | * | 1/2017 | Yang | H02M 3/157 |
| 10,782,718 B2 | | 9/2020 | Hu et al. | |
| 11,163,326 B2 | | 11/2021 | Miao et al. | |
| 2017/0239468 A1 | * | 8/2017 | Lemke | A61K 31/4468 |
| 2018/0026550 A1 | * | 1/2018 | Dent | H02J 7/35 |
| | | | | 363/55 |

* cited by examiner

*Primary Examiner* — Rafael O De Leon Domenech
(74) *Attorney, Agent, or Firm* — Perkins Coie LLP

(57) ABSTRACT

A control integrated circuit for a voltage regulator has a feedback pin, a switching control pin, a current control pin, and a control circuit. The feedback pin receives a voltage feedback signal representative of an output voltage of the voltage regulator. The switching control pin provides a switching control signal to turn on and turn off at least one switch of the voltage regulator. The current control pin is coupled to a current exhausting circuit. The control circuit provides the switching control signal based on the voltage feedback signal and a reference voltage, to control the current exhausting circuit via the current control pin to change an output current of the voltage regulator, and to determine if the voltage regulator is likely to be damaged based on the voltage feedback signal during changing of the output current.

24 Claims, 20 Drawing Sheets

13

11

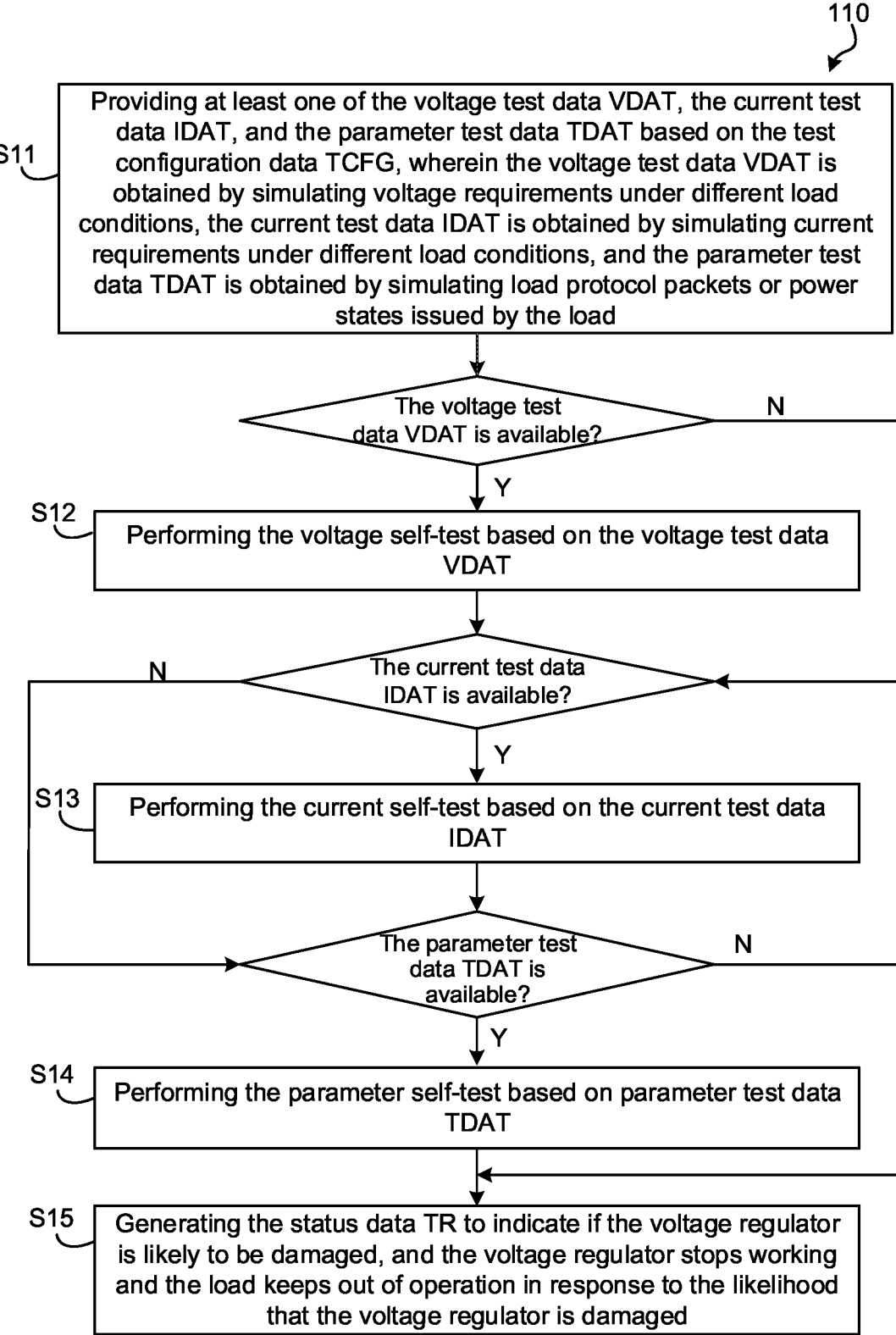

110

S11 — Providing at least one of the voltage test data VDAT, the current test data IDAT, and the parameter test data TDAT based on the test configuration data TCFG, wherein the voltage test data VDAT is obtained by simulating voltage requirements under different load conditions, the current test data IDAT is obtained by simulating current requirements under different load conditions, and the parameter test data TDAT is obtained by simulating load protocol packets or power states issued by the load The voltage test data VDAT is available?     N

Y

S12 — Performing the voltage self-test based on the voltage test data VDAT

The current test data IDAT is available?     N

Y

S13 — Performing the current self-test based on the current test data IDAT

The parameter test data TDAT is available?     N

Y

S14 — Performing the parameter self-test based on parameter test data TDAT

S15 — Generating the status data TR to indicate if the voltage regulator is likely to be damaged, and the voltage regulator stops working and the load keeps out of operation in response to the likelihood that the voltage regulator is damaged

FIG. 7

| Name | Description | Bits number |
|---|---|---|
| VDAT_SL1 | Rising slew rate SL1 of Vo | 4 |
| VDAT_SL2 | Falling slew rate SL2 of Vo | 4 |
| VDAT_Voini | Initial output voltage Voini | 4 |
| VDAT_Vocpl | Final output voltage Vocpl | 4 |
| IDAT_SL3 | Rising slew rate SL3 of Io | 4 |
| IDAT_SL4 | Falling slew rate SL4 of Io | 4 |
| IDAT_Ioini | Initial output current Ioini | 4 |
| IDAT_Iocpl | Final output current Iocpl | 4 |
| IDAT_Inum | a number of times Inum that Io changes bewteen Ioini and Iocpl | 4 |
| IDAT_Tdp2 | a duration Tdp2 during which Io remains at Ioini | 4 |
| IDAT_Tdp3 | a duration Tdp3 during which Io remains at Iocpl | 4 |
| TDAT_ Pn1 | Initial phase number Pn1 put into operation | 4 |
| TDAT_ Imode1 | Initial current mode Imode1 | 1 |
| TDAT_ Pn2 | Final phase number Pn2 put into operation | 4 |
| TDAT_ Imode2 | Final current mode Imode2 | 1 |
| TDAT_ Protocol | Simulated load protocol packets | 16 |

FIG. 8

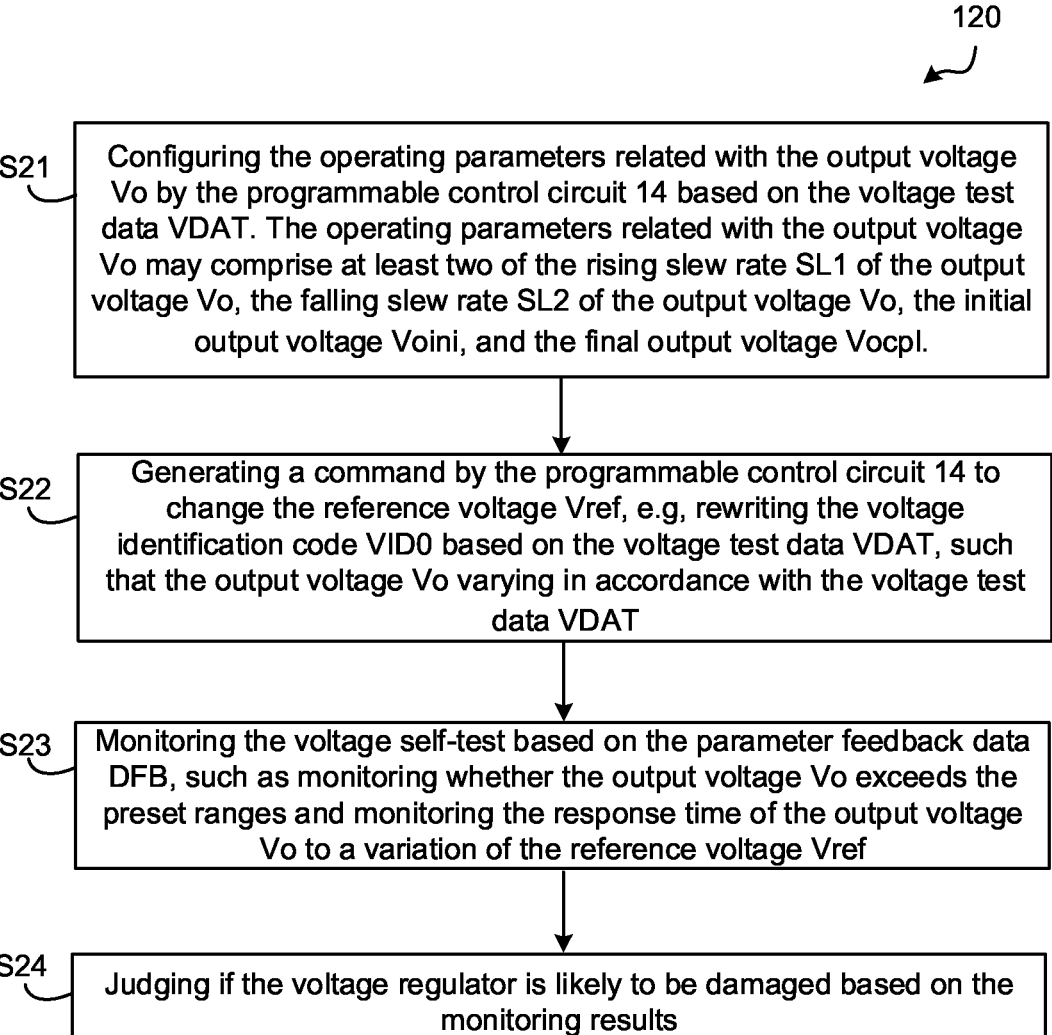

120

S21 — Configuring the operating parameters related with the output voltage Vo by the programmable control circuit 14 based on the voltage test data VDAT. The operating parameters related with the output voltage Vo may comprise at least two of the rising slew rate SL1 of the output voltage Vo, the falling slew rate SL2 of the output voltage Vo, the initial output voltage Voini, and the final output voltage Vocpl.

S22 — Generating a command by the programmable control circuit 14 to change the reference voltage Vref, e.g, rewriting the voltage identification code VID0 based on the voltage test data VDAT, such that the output voltage Vo varying in accordance with the voltage test data VDAT S23 — Monitoring the voltage self-test based on the parameter feedback data DFB, such as monitoring whether the output voltage Vo exceeds the preset ranges and monitoring the response time of the output voltage Vo to a variation of the reference voltage Vref S24 — Judging if the voltage regulator is likely to be damaged based on the monitoring results

S31    Configuring the operating parameters related with the output current Io
       by the programmable control circuit 14 based on the current test data
       IDAT. The operating parameters related with the output current Io may
       comprise at least two of the rising slew rate SL3 of the output current
       Io, the falling slew rate SL4 of the output current Io, the initial output
       current Ioini, the final output current Iocpl, the number of times Inum
       that the output current Io changes bewteen the initial output current
       Ioini and the final output current Iocpl, the duration Tdp2 during which
       the output current Io remains at the initial output current Ioini in one
       transition sycle, and the duration Tdp3 during which the output current
       Io remains at the final output current Iocpl in one transition sycle S32    Generating a comand by the programmable control circuit 14 to change
       the output current Io based on the current test data IDAT. For example,
       the current exhausting circuit is controlled to change the output current
       Io based on the current test data IDAT S33    Monitoring the current self-test based on the parameter feedback data
       DFB, such as monitoring one or more of whether the output voltage Vo
       after stabilized exceeds the preset ranges, e.g., the overvoltage
       tolerance band DOV and the undervoltage tolerance band DUV, an
       overshoot value VOS of the output voltage Vo, and an undershoot
       value VUS of the output voltage Vo.

S34    Judging if the voltage regulator is likely to be damaged based on the
       monitoring results

FIG. 12

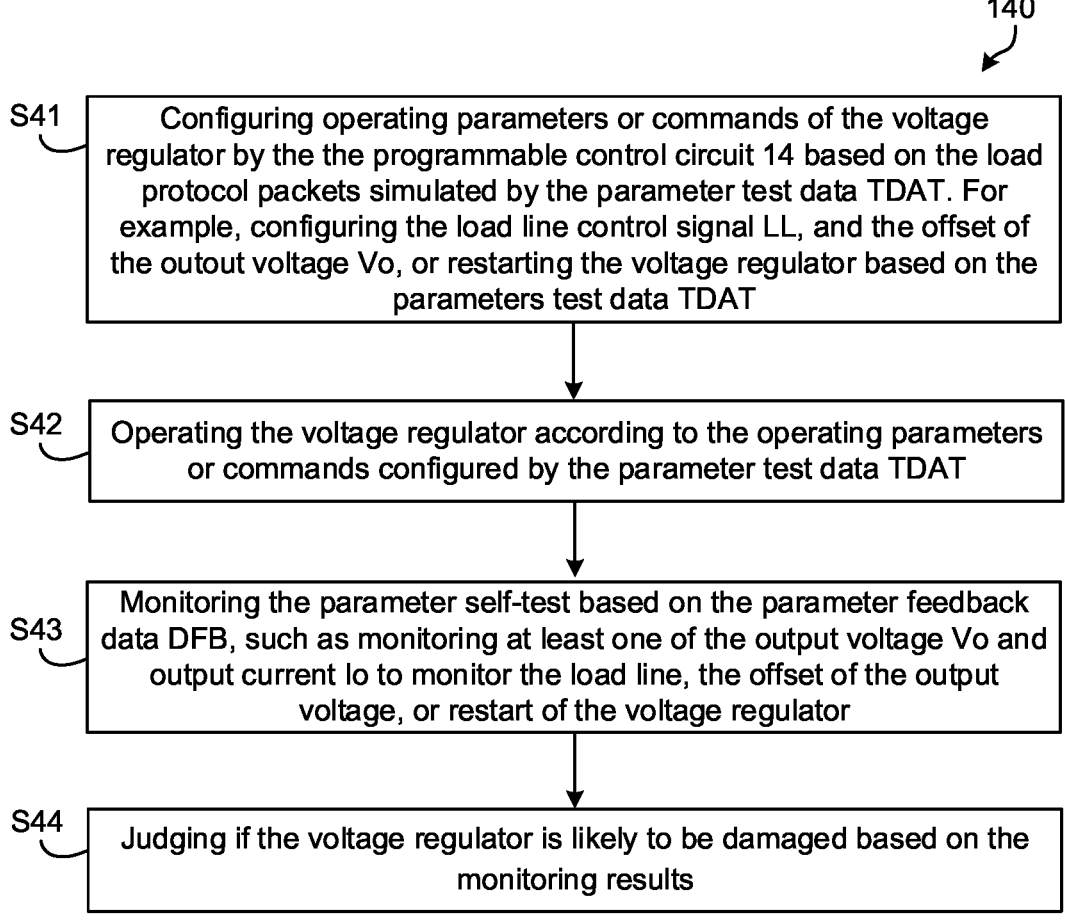

140

S41    Configuring operating parameters or commands of the voltage regulator by the the programmable control circuit 14 based on the load protocol packets simulated by the parameter test data TDAT. For example, configuring the load line control signal LL, and the offset of the outout voltage Vo, or restarting the voltage regulator based on the parameters test data TDAT S42    Operating the voltage regulator according to the operating parameters or commands configured by the parameter test data TDAT S43    Monitoring the parameter self-test based on the parameter feedback data DFB, such as monitoring at least one of the output voltage Vo and output current Io to monitor the load line, the offset of the output voltage, or restart of the voltage regulator S44    Judging if the voltage regulator is likely to be damaged based on the monitoring results

FIG. 17

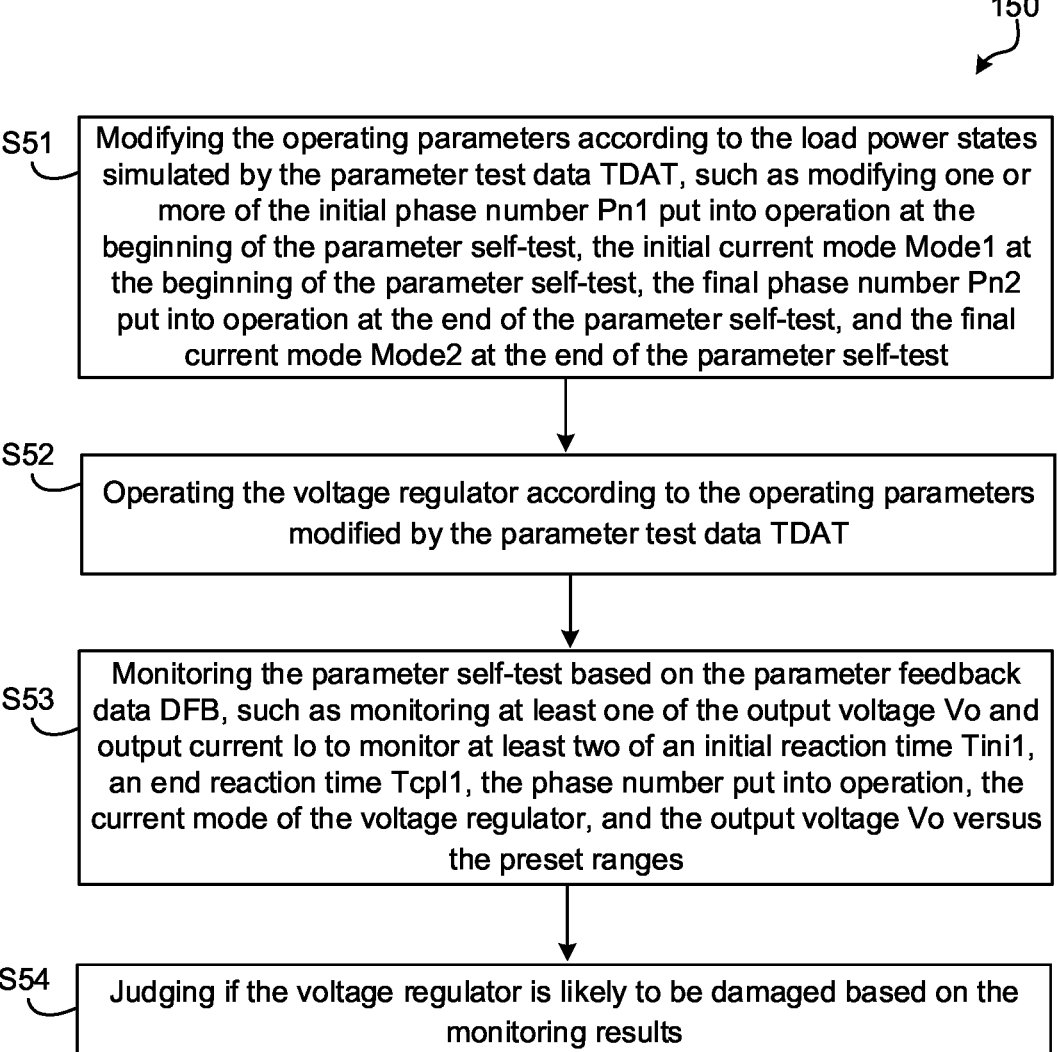

150

S51 — Modifying the operating parameters according to the load power states simulated by the parameter test data TDAT, such as modifying one or more of the initial phase number Pn1 put into operation at the beginning of the parameter self-test, the initial current mode Mode1 at the beginning of the parameter self-test, the final phase number Pn2 put into operation at the end of the parameter self-test, and the final current mode Mode2 at the end of the parameter self-test S52 — Operating the voltage regulator according to the operating parameters modified by the parameter test data TDAT S53 — Monitoring the parameter self-test based on the parameter feedback data DFB, such as monitoring at least one of the output voltage Vo and output current Io to monitor at least two of an initial reaction time Tini1, an end reaction time Tcpl1, the phase number put into operation, the current mode of the voltage regulator, and the output voltage Vo versus the preset ranges S54 — Judging if the voltage regulator is likely to be damaged based on the monitoring results

FIG. 18

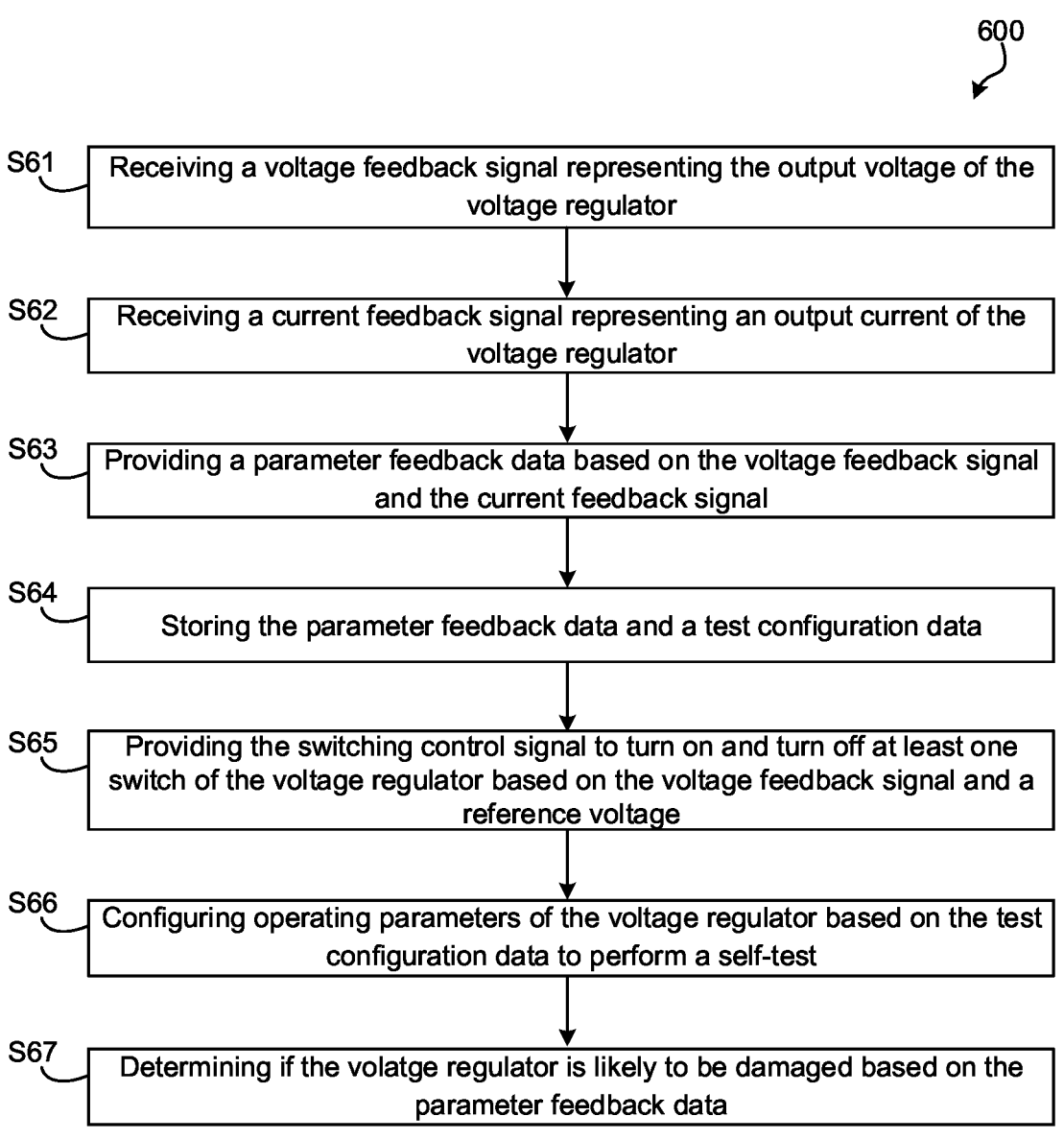

600

S61 — Receiving a voltage feedback signal representing the output voltage of the voltage regulator S62 — Receiving a current feedback signal representing an output current of the voltage regulator S63 — Providing a parameter feedback data based on the voltage feedback signal and the current feedback signal S64 — Storing the parameter feedback data and a test configuration data S65 — Providing the switching control signal to turn on and turn off at least one switch of the voltage regulator based on the voltage feedback signal and a reference voltage S66 — Configuring operating parameters of the voltage regulator based on the test configuration data to perform a self-test S67 — Determining if the volatge regulator is likely to be damaged based on the parameter feedback data

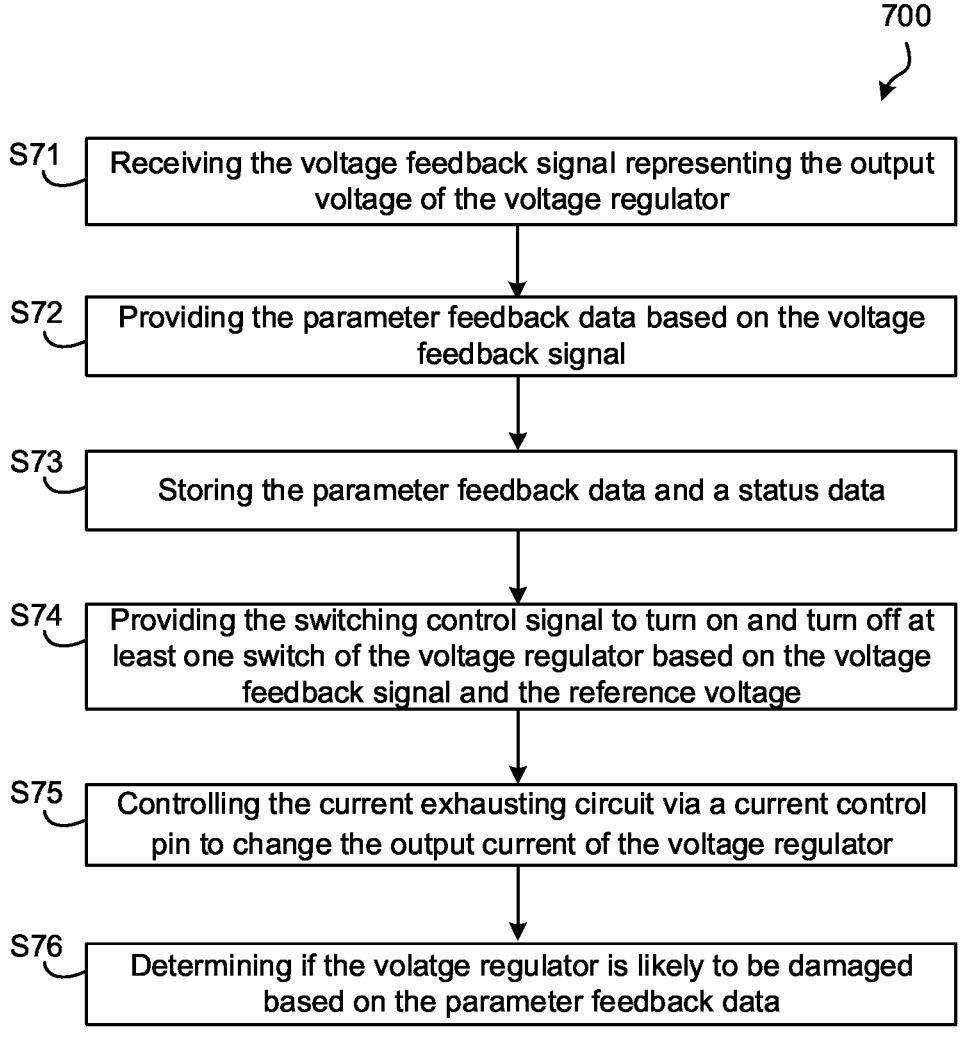

S71 — Receiving the voltage feedback signal representing the output voltage of the voltage regulator S72 — Providing the parameter feedback data based on the voltage feedback signal S73 — Storing the parameter feedback data and a status data S74 — Providing the switching control signal to turn on and turn off at least one switch of the voltage regulator based on the voltage feedback signal and the reference voltage S75 — Controlling the current exhausting circuit via a current control pin to change the output current of the voltage regulator S76 — Determining if the volatge regulator is likely to be damaged based on the parameter feedback data

FIG. 20

VOLTAGE REGULATOR WITH BUILT-IN AUTO TEST

CROSS-REFERENCE TO RELATED APPLICATIONS

This application claims the benefit of CN application Ser. No. 202310284144.3, filed on Mar. 20, 2023, and incorporated herein by reference.

BACKGROUND OF THE INVENTION

1. Field of the Invention

The present invention generally relates to electronic circuit, and more particularly but not exclusively relates to voltage regulator.

2. Description of Related Art

With development of processors, requirements for power supply become higher and more complex. A voltage regulator is usually used to provide stable power supply for a processor, and a DC converter is widely employed by the voltage regulator. To prevent damage of the processor, it is necessary to improve the reliability and security of the voltage regulator.

Generally, a comprehensive test of the voltage regulator is required. However, as power supply requirements of the processor become more complex, the comprehensive test of the voltage regulator becomes more complex too.

SUMMARY OF THE INVENTION

It is one of the objects of the present invention to provide a control integrated circuit (IC) for a voltage regulator, and a control method thereof.

One embodiment of the present invention discloses a control IC for a voltage regulator. The voltage regulator is configured to provide an output voltage and an output current to a processor load. The control IC comprises a a first feedback pin, a second feedback pin, an information acquisition circuit, a switching control pin, a first communication pin, a storage circuit, a reference generating circuit, and a programmable control circuit. The first feedback pin is configured to receive a voltage feedback signal representative of the output voltage. The second feedback pin is configured to receive a current feedback signal representative of the output current. The information acquisition circuit is configured to provide a parameter feedback data based on the voltage feedback signal and the current feedback signal. The switching control pin is configured to provide a switching control signal to turn on and turn off at least one switch of the voltage regulator. The first communication pin is configured to receive a voltage identification code to set the output voltage. The storage circuit is configured to store the parameter feedback data and a test configuration data. The reference generating circuit is configured to provide a reference voltage based on one of the voltage identification code and the test configuration data. The programmable control circuit is configured to provide the switching control signal based on the voltage feedback signal and the reference voltage, and configured to perform a self-test of the voltage regulator based on the test configuration data. During the self-test, the programmable control circuit is configured to set operating parameters of the voltage regulator based on the test configuration data, and the programmable control circuit is further configured to determine if the voltage regulator is likely to be damaged based on the parameter feedback data.

Another embodiment of the present invention discloses a control IC for a voltage regulator. The voltage regulator is configured to provide an output voltage and an output current to a processor load. The control IC comprises a first feedback pin, an information acquisition circuit, a switching control pin, a storage circuit, a communication pin, a current control pin, and a programmable control circuit. The first feedback pin is configured to receive a voltage feedback signal representative of the output voltage. The information acquisition circuit is configured to provide a parameter feedback data based on the voltage feedback signal. The switching control pin is configured to provide a switching control signal to turn on and turn off at least one switch of the voltage regulator. The storage circuit is configured to store the parameter feedback data and a status data. The communication pin is coupled to the storage circuit. The current control pin is configured to be coupled to a current exhausting circuit. The programmable control circuit is configured to provide the switching control signal based on the voltage feedback signal and a reference voltage, configured to control the current exhausting circuit via the current control pin to set operating parameters related with the output current during a self-test, and configured to determine if the voltage regulator is likely to be damaged based on the parameter feedback data and provide the status data accordingly.

Yet another embodiment of the present invention discloses a control IC for a voltage regulator. The control IC comprises a feedback pin, a switching control pin, a current control pin, and a programmable control circuit. The feedback pin is configured to receive a voltage feedback signal representative of an output voltage of the voltage regulator. The switching control pin is configured to provide a switching control signal to turn on and turn off at least one switch of the voltage regulator. The current control pin is configured to be coupled to a current exhausting circuit. The programmable control circuit is configured to provide the switching control signal based on the voltage feedback signal and a reference voltage, configured to control the current exhausting circuit via the current control pin to change an output current of the voltage regulator, and configured to determine if the voltage regulator is likely to be damaged based on the voltage feedback signal during changing of the output current.

Yet another embodiment of the present invention discloses a control method for a voltage regulator. The voltage regulator is configured to provide an output voltage and an output current to a processor load. Receiving a voltage feedback signal representing the output voltage. Receiving a current feedback signal representing the output current. Providing a parameter feedback data based on the voltage feedback signal and the current feedback signal. Storing the parameter feedback data and a test configuration data in a storage circuit. Providing a switching control signal to turn on and turn off at least one switch of the voltage regulator based on the voltage feedback signal and a reference voltage. Configuring operating parameters of the voltage regulator based on the test configuration data to perform a self-test. Determining if the voltage regulator is likely to be damaged based on the parameter feedback data.

These and other features of the present invention will be readily apparent to persons of ordinary skill in the art upon reading the entirety of this disclosure, which comprises the accompanying drawings and claims.

BRIEF DESCRIPTION OF DRAWINGS

The present invention can be further understood with reference to the following detailed description and the appended drawings, wherein like elements are provided with like reference numerals.

FIG. 7 illustrates a self-test method 110 in accordance with an embodiment of the present invention.

FIG. 8 illustrates a test configuration data TCFG in accordance with an embodiment of the present invention.

FIG. 9 illustrates a voltage self-test method 120 in accordance with an embodiment of the present invention.

FIG. 12 illustrates a current self-test method 130 in accordance with an embodiment of the present invention.

FIG. 17 illustrates a parameter self-test method 140 in accordance with an embodiment of the present invention.

FIG. 18 illustrates a parameter self-test method 150 in accordance with another embodiment of the present invention.

FIG. 19 illustrates a control method 600 for a voltage regulator in accordance with an embodiment of the present invention.

FIG. 20 illustrates a control method 700 for a voltage regulator in accordance with another embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
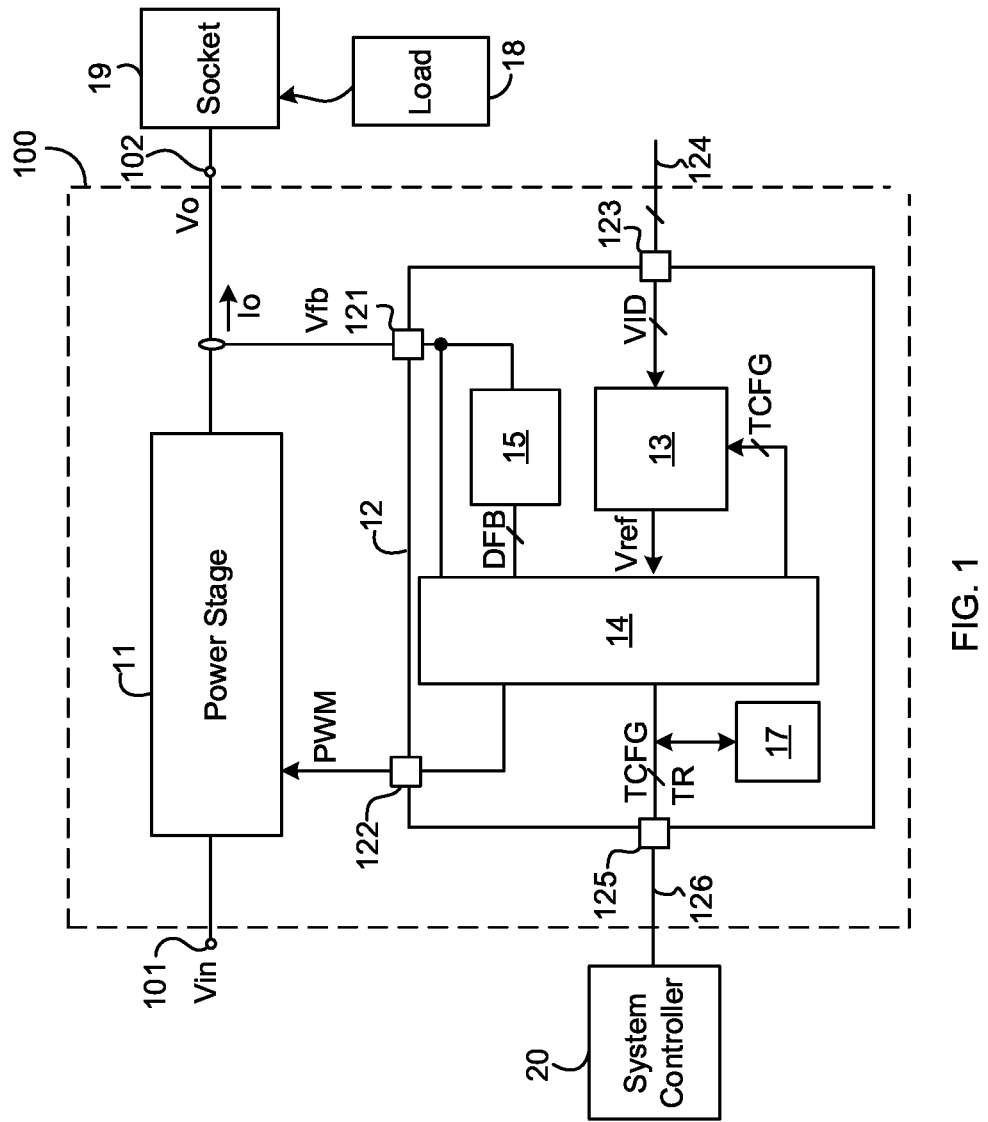
FIG. 1 schematically illustrates a voltage regulator 100 in accordance with an embodiment of the present invention.

FIG. 1 schematically illustrates a voltage regulator 100 in accordance with an embodiment of the present invention. The voltage regulator 100 has a power stage 11 and a control integrated circuit (IC) 12. The power stage 11 receives an input voltage Vin at an input terminal 101 and provides an output voltage Vo and an output current Io at an output terminal 102. The power stage 11 may comprise a single-phase switching circuit or a multiphase switching circuit. The control IC 12 comprises a feedback pin 121, a switching control pin 122, a reference generating circuit 13, a programmable control circuit 14, an information acquisition circuit 15, and a storage circuit 17. The feedback pin 121 receives a voltage feedback signal Vfb representative of the output voltage Vo. The switching control pin 122 provides a switching control signal PWM to turn on and turn off at least one switch of the voltage regulator 100 in the power stage 11, such that the power stage 11 converts the input voltage Vin to the output voltage Vo. In one embodiment, the output terminal 102 is coupled to a socket 19, and a load 18 may be mounted on or removed from the socket 19, for example in a pluggable manner. The load 18 may comprise a processor, such as a central processing unit (CPU), a graphics processing unit (GPU), and so on. In one embodiment, the voltage regulator 100 and the socket 19 may be mounted on a same printed circuit board (PCB).

The reference generating circuit 13 provides a reference voltage Vref based on a voltage identification code VID or a test configuration data TCFG. In one embodiment, the voltage identification code VID representative of a target value of the output voltage Vo required by the load 18. In normal operation, the load 18 can provide instructions to the voltage regulator 100 based on its operating status, with the voltage identification code VID and/or a voltage slew rate command used to control a slew rate of the output voltage Vo during transition. For example, when the load 18 needs to process a large amount of data at an extra high speed, it will send the voltage identification code VID and the voltage slew rate command to the voltage regulator 100, e.g., requiring the output voltage Vo to be adjusted from 0.5V to 0.8V with the slew rate of 10 mV/us. The information acquisition circuit 15 receives the voltage feedback signal Vfb and provides the parameter feedback data DFB based on the voltage feedback signal Vfb. The parameter feedback data DFB may comprise a digital signal obtained by high-speed analog-to-digital conversion of the voltage feedback signal Vfb. In one embodiment, the storage circuit 17 is used to store the parameter feedback data DFB and the test configuration data TCFG. The storage circuit 17 may comprise one or more of a read only memory (ROM), a random access memory (RAM) and a non-volatile memory (NVM), etc.

The programmable control circuit 14 provides the switching control signal PWM based on the voltage feedback signal Vfb and the reference voltage Vref, and performs a self-test based on the test configuration data TCFG under the condition that the load 18 is not actually put into operation. During the self-test, the programmable control circuit 14 configures the operating parameters of the voltage regulator 100 based on the test configuration data TCFG, determines if the voltage regulator 100 is likely to be damaged based on the parameter feedback data DFB, and provides a status data TR. In one embodiment, the operating parameters are circuit parameters or configurations during operation of the voltage regulator 100. In one embodiment, the storage circuit 17 is further used to store the status data TR.

In one embodiment, the test configuration data TCFG is used to simulate the power supply requirements issued from the load 18 to the voltage regulator 100. The self-test performed by the voltage regulator 100 may comprise one or more of a voltage self-test, a current self-test, and a parameter self-test. In one embodiment, the test configuration data TCFG is used to simulate the power supply requirements issued by the load 18 to set the operating parameters related with the target of the output voltage Vo and voltage transition slew rates under different conditions, and the programmable control circuit 14 provides a voltage test data VDAT based on the test configuration data TCFG to perform the voltage self-test. In one embodiment, the test configuration data TCFG is used to simulate the power supply requirements issued by the load 18 to set the operating parameters related with the output current Io under different conditions, and the programmable control circuit 14 provides a current test data IDAT based on the test configuration data TCFG to change the output current Io and perform the current self-test. In one embodiment, the test configuration data TCFG is used to simulate a load protocol packet or power states (PS) issued by the load 18, and the programmable control circuit 14 provides a parameter test data TDAT based on the test configuration data TCFG to perform the parameter self-test. The power states are defined by the load supplier, for example, a high-power state PS0, low-power states PS1-PS2, an ultra-low-power state PS3, etc. Corresponding to different power states, the voltage regulator 100 are required to operate under different conditions, for example with different number of phase circuits put into operation, and/or with different current modes.

In one example, the operating parameters of the voltage regulator 100 set by the test configuration data TCFG during the self-test comprises the slew rate of the output voltage Vo and the target of the output voltage Vo at the end of the self-test. In another example, the operating parameters of the voltage regulator 100 set by the test configuration data TCFG during the self-test comprises a slew rate of the output current Io, an initial output current, and a final output current. In another example, the operating parameters of the voltage regulator 100 set by the test configuration data TCFG during the self-test further comprises a number of times that the output current Io changes between the initial output current and the final output current, a first duration during which the output current Io remains at the initial output current, and a second duration during which the output current Io remains at the final output current. In another example, the operating parameters of the voltage regulator 100 set by the test configuration data TCFG during the self-test further comprises an initial phase number put into operation, an initial current mode, a final phase number put into operation, a final current mode, and so on.

In one example, during the self-test of the voltage regulator 100, the load 18 is not actually put into operation, for example, it is removed from the socket 19, or it is not enabled. The voltage regulator 100 provides the output voltage Vo and the output current Io according to the test configuration data TCFG which simulates the power supply requirements issued by the load 18, that is the output power is normally provided during the self-test. The output voltage Vo, the output current Io, and an output power are consistent with the situation that the load 18 is actually put into operation. When the self-test of voltage regulator 100 is complete, and if the control IC 12 judges that there is no possibility of damage of the voltage regulator 100, the control IC 12 transits from a self-test operation to a normal operation, and the load 18 works normally, i.e., put into operation. For example, the load 18 is connected to the socket 19 or converted from being disabled to enabled, and the voltage regulator 100 provides power to the load 18. In one embodiment, when there is a possibility of damage of the voltage regulator 100, the voltage regulator 100 immediately stops working and the load 18 is kept out of operation. In another embodiment, when there is a possibility of damage of the voltage regulator 100, the regulator 100 stops working after all self-test items are complete.

In one embodiment, the control IC 12 further comprises a communication pin 123. The communication pin 123 can be configured to receive the voltage identification code VID for setting the output voltage Vo, e.g., receiving the voltage identification code VID from the load 18 through a communication bus 124, the load 18 could also send load protocol packets (such as CPU protocol packets, GPU protocol packets, etc.) to the voltage regulator 100 through the communication bus 124 or another communication bus. The load protocol packets comprise power supply requirements issued by the load 18 to the voltage regulator 100 other than the voltage identification code VID. In one embodiment, the communication bus 124 may comprise a serial communication bus SVID, a parallel communication bus PVID, and so on.

In one embodiment, the control IC 12 further comprises a communication pin 125. The communication pin 125 can be configured to receive the test configuration data TCFG and send out the status data TR, e.g., receive the test configuration data TCFG from a system controller 20 through a communication bus 126, and send out the status data TR to the system controller 20 through the communication bus 126. Based on the status data TR, the system controller 20 decides whether to put the load 18 into operation, such as enabling the load 18. In one embodiment, the user may obtain and analyze the status data TR stored in the storage circuit 17 through the communication pin 125. In one embodiment, the test configuration data TCFG is input by the user (for example, through a graphical user interface). The system controller 20 may be a baseboard management controller (BMC) provided by the motherboard vendor or a test controller provided by the IC vendor. In one embodiment, the communication bus 126 may be a serial communication bus, such as an Inter-Integrated Circuit (I2C) Bus, a system management bus (SMBus), a power management bus (PMBus), and so on.

The control IC 12 could perform self-test automatically, which could greatly reduce the labor cost on these simple, tedious and repeated tests, while find the damage of the voltage regulator 100 in time after it is assembled on the printed circuit board where the load 18 is located. Different with traditional test, after the voltage regulator 100 is assembled on the printed circuit board where the load 18 is located, the control IC 12 can still perform self-test to determine whether the voltage regulator 100 is likely to be damaged, without relying on the test environment, test location, and external test equipments connected to the general purpose interface bus (GPIB). Such that a built-in test program of the control IC could perform the self-test anytime needed, even without a test bench provided by the control IC supplier, and messy connections to external test equipments could be avoided. Thus the self-test provided by embodiments of the present invention not only improves a flexibility, but also improves the reliability and safety of the voltage regulator 100, to prevent the load 18 from damage caused by the voltage regulator 100. The self-test of the embodiments of the present invention does not need to actually put the load 18 into operation, but the test configuration data TCFG could simulate power supply requirements of the load 18 under different conditions, the output voltage Vo and the output current Io are the same as the actual operation with the load 18, which also ensures the reliability of the test results and avoids the risk that the load 18 being damaged during the self-test.

Figure 2:
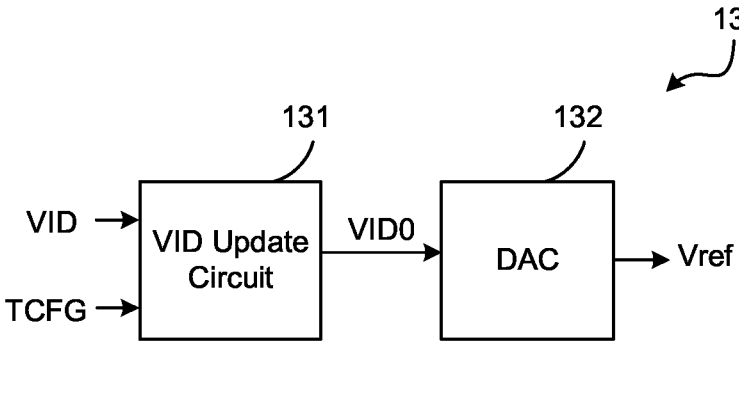
FIG. 2 schematically illustrates a reference generating circuit 13 in accordance with an embodiment of the present invention.

FIG. 2 schematically illustrates a reference generating circuit 13 in accordance with an embodiment of the present invention. In the embodiment shown in FIG. 2, the reference generating circuit 13 has a VID update circuit 131, and a digital-to-analog converter (DAC) 132. The VID update circuit 131 receives the voltage identification code VID and the test configuration data TCFG, and provides the updated voltage identification code VIDO based on the voltage identification code VID or the test configuration data TCFG. The DAC 132 converts the updated voltage identification code VIDO to the reference voltage Vref through a digital to analog conversion. In one embodiment, the VID update circuit 131 could control the updated voltage identification code VIDO being changed to a predetermined value with a programmable slew rate based on the test configuration data TCFG. In one embodiment, when the control IC 12 and the load 18 are normally working, the control IC 12 receives the voltage identification code VID from the load 18 through the communication pin 123, and the reference generating circuit 13 generates the reference voltage Vref according to the voltage identification code VID. In one embodiment, during the self-test, the reference generating circuit 13 generates the reference voltage Vref according to the test configuration data TCFG.

Figure 3:
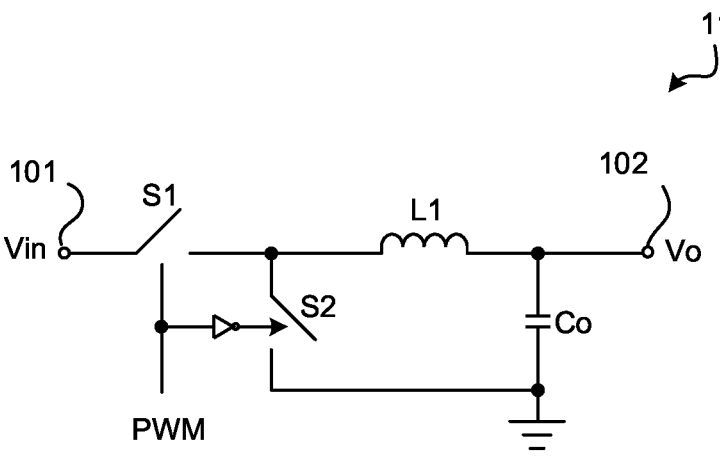
FIG. 3 schematically illustrates a power stage 11 in accordance with an embodiment of the present invention.

FIG. 3 schematically illustrates a power stage 11 in accordance with an embodiment of the present invention. In the embodiment shown in FIG. 3, the power stage 11 is a single phase switching circuit, and it is known to those skilled in the art that the power stage 11 can also comprise a multiphase switching circuit. In one embodiment, the power stage 11 is a buck circuit, comprising a high-side switch S1, a low-side switch S2, an inductor L1, and an output capacitor Co, and the detailed circuit connection is shown in FIG. 3. In one embodiment, the high-side switch S1 and the low-side switch S2 are complementary turned on under the control of the switching control signal PWM, to convert the input voltage Vin to the output voltage Vo. One with ordinary skill in the art should also understand the power stage 11 may also comprise any other suitable circuit topology, not limited to the embodiment shown in FIG. 3.

Figure 4:
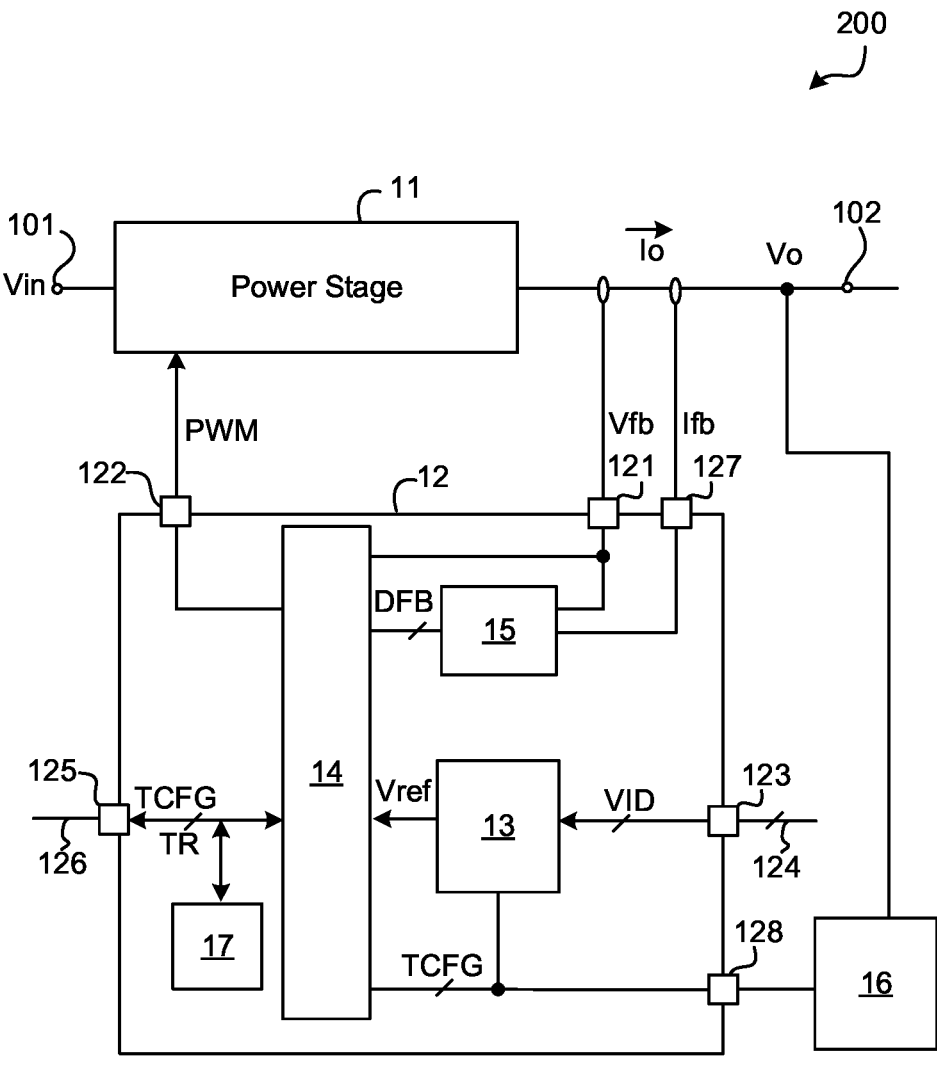
FIG. 4 schematically illustrates a voltage regulator 200 in accordance with an embodiment of the present invention.

FIG. 4 schematically illustrates a voltage regulator 200 in accordance with an embodiment of the present invention. In the embodiment shown in FIG. 4, the voltage regulator 200 further comprises a current control pin 128. In one embodiment, the current control pin 128 is coupled to a current exhausting circuit 16 for the self-test. The programmable control circuit 14 controls the current exhausting circuit 16 through the current control pin 128 to change the output current Io of the voltage regulator 200. The current exhausting circuit 16 may comprise one or more transistors, controllable resistors, etc. In one embodiment, the programmable control circuit 14 controls the current exhausting circuit 16 based on the test configuration data TCFG to perform the current self-test.

In the embodiment shown in FIG. 4, the control IC 12 further comprises a feedback pin 127 to receive a current feedback signal Ifb representing the output current Io of the voltage regulator 200. In the embodiment shown in FIG. 4, the information acquisition circuit 15 receives the voltage feedback signal Vfb and the current feedback signal Ifb, and provides the parameter feedback data DFB based on the voltage feedback signal Vfb and the current feedback signal Ifb to reflect the operating condition of the voltage regulator 200 during the self-test, so that the control IC 12 could further judge whether the voltage regulator 200 is damaged. In one embodiment, the parameter feedback data DFB may comprise a digital signal obtained from high speed analog-to-digital conversion of the voltage feedback signal Vfb and the current feedback signal Ifb. In one embodiment, during the self-test, the programmable control circuit 14 determines whether the voltage regulator 200 is likely to be damaged based on the parameter feedback data DFB and provides the status data TR. In the embodiment shown in FIG. 4, when the load 18 is not actually put into operation, the current exhausting circuit 16 can be controlled by the control IC 12 to change the output current Io, so as to fully simulate the current demand of the load 18 in different conditions and test whether the voltage regulator 200 is likely to be damaged under different load conditions.

Figure 5:
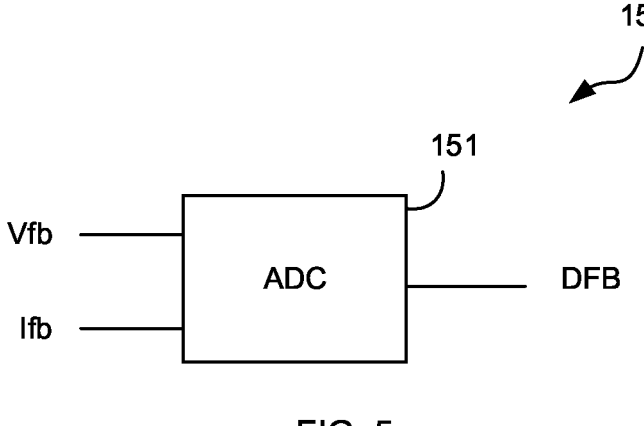
FIG. 5 schematically illustrates an information acquisition circuit 15 in accordance with an embodiment of the present invention.

FIG. 5 schematically illustrates an information acquisition circuit 15 in accordance with an embodiment of the present invention. In the embodiment shown in FIG. 5, the information acquisition circuit 15 comprises an analog-to-digital converter (ADC) 151. The ADC 151 executes analog-to-digital conversion on the voltage feedback signal Vfb and the current feedback signal Ifb respectively, and provides the parameter feedback data DFB accordingly.

Figure 6:
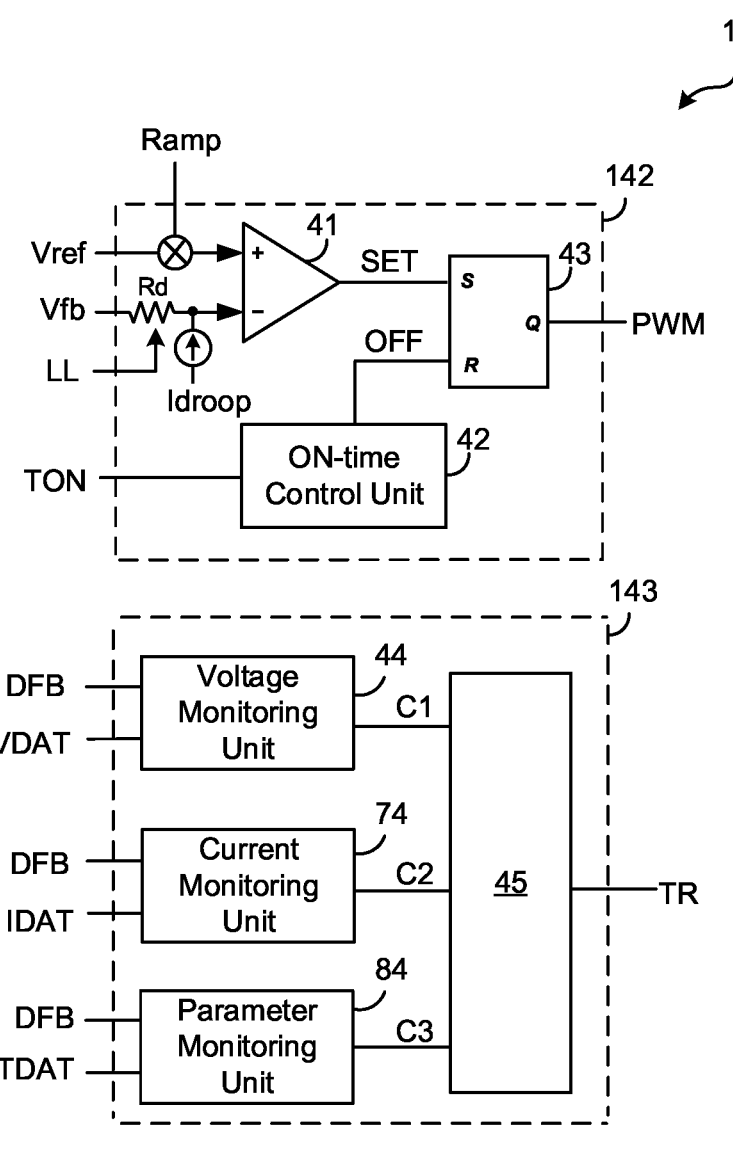
FIG. 6 schematically illustrates a programmable control circuit 14 in accordance with an embodiment of the present invention.

FIG. 6 schematically illustrates a programmable control circuit 14 in accordance with an embodiment of the present invention. In the embodiment shown in FIG. 6, the programmable control circuit 14 comprises a switching control unit 142 and an operating unit 143.

The switching control unit 142 provides the switching control signal PWM based on the voltage feedback signal Vfb and the reference voltage Vref. In the embodiment shown in FIG. 6, the switching control unit 142 comprises a comparator 41, an RS flip-flop 43, and an on-time control unit 42. The comparator 41 provides a turn-on control signal SET based on the voltage feedback signal Vfb and the reference voltage Vref, to turn on at least one phase circuit of the power stage 11 (such as turn on at least one switch). In one embodiment, a slope compensation signal Ramp can be superimposed to the reference voltage Vref or the feedback signal Vfb to increase the stability of the power stage 11. The on-time control unit 42 provides a turn-off control signal OFF based on an ON-time period signal TON to turn off at least one phase circuit of the power stage 11 (such as turn off at least one switch). The RS flip-flop 43 comprises a set terminal S, a reset terminal R and an output terminal Q.

The set terminal S receives the turn-on control signal SET, the reset terminal R receives the turn-off control signal OFF, and the output terminal Q generates the switching control signal PWM based on the turn-on control signal SET and the turn-off control signal OFF. In one embodiment, the voltage feedback signal Vfb is coupled to the comparator 41 through a resistor Rd, and a load line control signal LL is used to control resistance of the resistor Rd, so as to control a curve of the output voltage Vo versus the output current Io (such as decreasing the output voltage Vo with increasing of the output current Io), that is, to control a load line. One with ordinary skill in the art should understand that the switching control unit 142 is not limited to the embodiment shown in FIG. 6, but may also comprise other suitable circuit structures.

In one embodiment, the operating unit 143 provides the status data TR based on the parameter feedback data DFB, which is used to determine whether the voltage regulator 200 is likely to be damaged. The operating unit 143 compares the parameter feedback data DFB with one or more preset ranges determined by the test configuration data TCFG to produce the status data TR. In one embodiment, the operating unit 143 comprises a voltage monitoring unit 44, a current monitoring unit 74, a parameter monitoring unit 84, and an analysis and report unit 45. The voltage monitoring unit 44 receives the parameter feedback data DFB and the voltage test data VDAT, and generates a comparison data C1 according to whether a corresponding part of the parameter feedback data DFB is within one or more preset ranges determined by the voltage test data VDAT. The current monitoring unit 74 receives the parameter feedback data DFB and the current test data IDAT, and generates a comparison data C2 according to whether a corresponding part of the parameter feedback data DFB is within one or more preset ranges determined by the current test data IDAT. The parameter monitoring unit 84 receives the parameter feedback data DFB and the parameter test data TDAT, and generates a comparison data C3 according to whether a corresponding part of the parameter feedback data DFB is within one or more preset ranges determined by the parameter test data TDAT. The analysis and report unit 45 produces the status data TR based on the comparison datas C1-C3. When the corresponding part of the parameter feedback data DFB exceeds the preset ranges determined by either the voltage test data VDAT, the current test data IDAT, or the parameter test data TDAT, the status data TR indicates that the voltage regulator is likely to be damaged. One with ordinary skill in the art should understand that the operating unit 143 is not limited to the embodiment shown in FIG. 6, but may also comprise other suitable circuit structures.

FIG. 7 illustrates a self-test method 110 in accordance with an embodiment of the present invention. The self-test method 110 has steps S11-S15.

At the step S11, providing at least one of the voltage test data VDAT, the current test data IDAT, and the parameter test data TDAT based on the test configuration data TCFG, wherein the voltage test data VDAT is obtained by simulating voltage requirements under different load conditions, the current test data IDAT is obtained by simulating current requirements under different load conditions, and the parameter test data TDAT is obtained by simulating load protocol packets or power states issued by the load. If the voltage test data VDAT is available, then entering the step S12, to perform the voltage self-test based on the voltage test data VDAT. If the current test data IDAT is available, then entering the step S13, to perform the current self-test based on the current test data IDAT. And if the parameter test data TDAT is available, then entering the step S14, to perform the parameter self-test based on the the parameter test data TDAT. At the step S15, generating the status data TR to indicate if the voltage regulator is likely to be damaged, the voltage regulator stops working and the load keeps out of operation in response to the likelihood that the voltage regulator is damaged. Note that in the flow chart described above, the box functions may also be implemented with different order as shown in FIG. 7. Two successive box functions may be executed meanwhile, or sometimes the box functions may be executed in a reverse order.

FIG. 8 illustrates a test configuration data TCFG in accordance with an embodiment of the present invention. In one embodiment, the test configuration data TCFG comprises the voltage test data VDAT, the current test data IDAT, and the parameter test data TDAT. In another embodiment, at least one of the voltage test data VDAT, the current test data IDAT, and the parameter test data TDAT is generated from the test configuration data TCFG.

In the embodiment shown in FIG. 8, the voltage test data VDAT comprises VDAT_SL1, VDAT_SL2, VDAT_Voini, VDAT_Vocpl. VDAT_SL1 is used to set a rising slew rate SL1 of the output voltage Vo during the voltage self-test, which has 4 bits as one example. VDAT_SL2 is used to set a falling slew rate SL2 of the output voltage Vo during the voltage self-test, which has 4 bits as one example. VDAT_Voini is used to set an initial output voltage Voini during the voltage self-test, which has 4 bits as one example. VDAT_Vocpl is used to set a final output voltage Vocpl during the voltage self-test, which has 4 bits as one example.

In the embodiment shown in FIG. 8, the current test data IDAT comprises IDAT_SL3, IDAT_SL4, IDAT_Ioini, IDAT_Iocpl, IDAT_Inum, IDAT_Tdp2, IDAT_Tdp3. IDAT_SL3 is used to set a rising slew rate SL3 of the output current during the current self-test, which has 4 bits as one example. IDAT_SL4 is used to set a falling slew rate SL4 of the output current Io during the current self-test, which has 4 bits as one example. IDAT_Ioini is used to set an initial output current Ioini during the current self-test, which has 4 bits as one example. IDAT_Iocpl is used to set a final output current Iocpl during the current self-test, which has 4 bits as one example. IDAT_Inum is used to set a number of times Inum that the output current Io changes bewteen the initial output current Ioini and the final output current Iocpl during the current self-test, which has 4 bits as one example. IDAT_Tdp2 is used to set a duration Tdp2 during which the output current Io remains at the initial output current Ioini during the current self-test, which has 4 bits as one example. IDAT_Tdp3 is used to set a duration Tdp3 during which the output current Io remains at the final output current Iocpl during the current self-test.

In the embodiment shown in FIG. 8, the parameter test data TDAT comprises TDAT_Pn1, TDAT_Imode1, TDAT_Pn2, TDAT_Imode2, TDAT_Protocol. TDAT Pn1 is used to set an initial phase number Pn1 put into operation during the parameter self-test, which has 4 bits as one example. TDAT_Imode1 is used to set an initial current mode Imode1 (such as continuous current mode or discontinuous current mode) during the parameter self-test, which has 4 bits as one example. TDAT_Pn2 is used to set a final phase number Pn2 put into operation during the parameter self-test, which has 4 bits as one example. TDAT_Imode2 is used to set a final current mode Imode2 (such as continuous current mode or discontinuous current mode) during the parameter self-test, which has 4 bits as one example. TDAT_Protocol is used to set simulated load protocol packets during the parameter self-test, which has 16 bits as one example. In one example, contents of the load protocol packets simulated by TDAT_Protocol may comprise a power states command, an output voltage offset command, a load line command, a power reset command, and so on. The load line command may be used to control level of the output voltage Vo under different output current Io, or the slew rate of the output voltage Vo varying with the output current Io.

FIG. 9 illustrates a voltage self-test method 120 in accordance with an embodiment of the present invention. The voltage self-test method 120 has steps S21-S24. One with ordinary skill in the art should understand that the voltage self-test method is not limited to the specific embodiment shown in FIG. 9.

At the step S21, configuring the operating parameters related with the output voltage Vo by the programmable control circuit 14 based on the voltage test data VDAT. The operating parameters related with the output voltage Vo may comprise at least two of the rising slew rate SL1 of the output voltage Vo, the falling slew rate SL2 of the output voltage Vo, the initial output voltage Voini, and the final output voltage Vocpl. In one embodiment, the operating parameters related with the output voltage Vo is set via changing the reference voltage Vref based on the voltage test data VDAT.

At the step S22, generating a command by the programmable control circuit 14 to change the reference voltage Vref, e.g, rewriting the voltage identification code VIDO based on the voltage test data VDAT, such that the output voltage Vo varying in accordance with the voltage test data VDAT.

At the step S23, monitoring the voltage self-test based on the parameter feedback data DFB, such as monitoring whether the output voltage Vo exceeds the preset ranges and monitoring the response time of the output voltage Vo to a variation of the reference voltage Vref. The preset ranges may vary with the reference voltage Vref in real time. In one example, the preset ranges may comprise an overvoltage tolerance band DOV and an undervoltage tolerance band DUV of the output voltage Vo. The overvoltage tolerance band DOV may comprise a voltage range that is less than the sum of the reference voltage Vref and an overvoltage threshold 0V (Vo<Vref+0V), the undervoltage tolerance band DUV may comprise a voltage range that is greater than the difference between the reference voltage Vref and an undervoltage threshold UV (Vo>Vref−UV). The response time may comprise a delay time period Tdel of the output voltage Vo responding to variation of the reference voltage Vref, and a duration Tdp of the output voltage Vo responding to variation of the reference voltage Vref.

At the step S24, judging if the voltage regulator is likely to be damaged based on the monitoring results at the step S23. In one embodiment, the possibility of damage of the voltage regulator is judged by the programmable control circuit 14. In another embodiment, the monitoring results are send to the system controller 20, and the possibility of damage of the voltage regulator is judged by the system controller 20.

Figure 10:
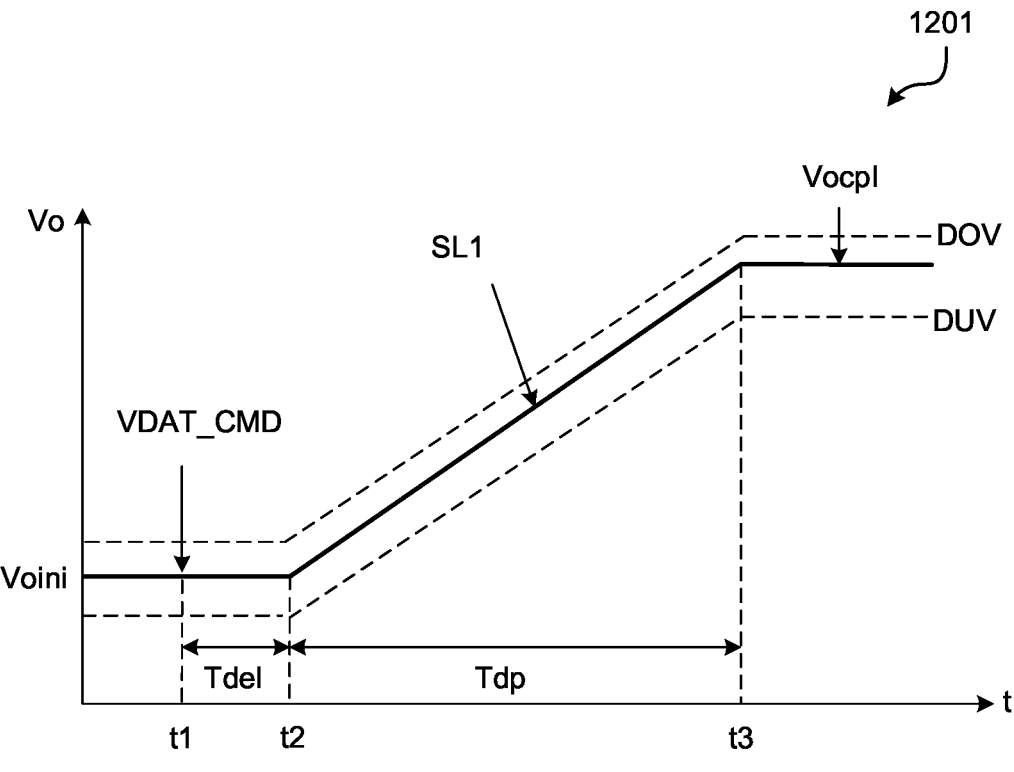
FIG. 10 illustrates a timing diagram 1201 during the voltage self-test in accordance with an embodiment of the present invention.

FIG. 10 illustrates a timing diagram 1201 during the voltage self-test in accordance with an embodiment of the present invention. In one embodiment, before time t1, the rising slew rate SL1 of the output voltage Vo during the voltage self-test, the initial output voltage Voini at the beginning of the voltage self-test, and the final output voltage Vocpl at the end of the voltage self-test are configured by the programmable control circuit 14 based on the voltage test data VDAT. At time t1, the programmable control circuit 14 sends a command VDAT_CMD to initiate the voltage self-test, the reference voltage Vref varies based on the voltage test data VDAT. At time t2, the voltage regulator responds to the command VDAT_CMD, and the output voltage Vo begins to change based on the voltage test data VDAT. For example, the output voltage increases from the initial output voltage Voini to the final output voltage Vocpl with the rising slew rate SL1. At time t3, the output voltage Vo reaches the final output voltage Vocpl, and the voltage self-test is finished. During the voltage self-test, the programmable control circuit 14 monitors whether the output voltage Vo exceeds the preset ranges, e.g., the overvoltage tolerance band DOV and the undervoltage tolerance band DUV. In one embodiment, the delay time period Tdel of the output voltage Vo responding to variation of the reference voltage Vref is monitored by the programmable control circuit 14, e.g, monitoring a time period from time t1 that the voltage self-test starts to time t2 that the output voltage Vo begins to change. In one embodiment, the duration Tdp of the output voltage Vo responding to variation of the reference voltage Vref is monitored by the programmable control circuit 14, e.g., monitoring a time period from time t2 to time t3 when the output voltage Vo reaches the final output voltage Vocpl. In one embodiment, the programmable control circuit 14 or the system controller 20 determines whether the voltage regulator is likely to be damaged based on the above parameters monitored during the voltage self-test.

Figure 11:
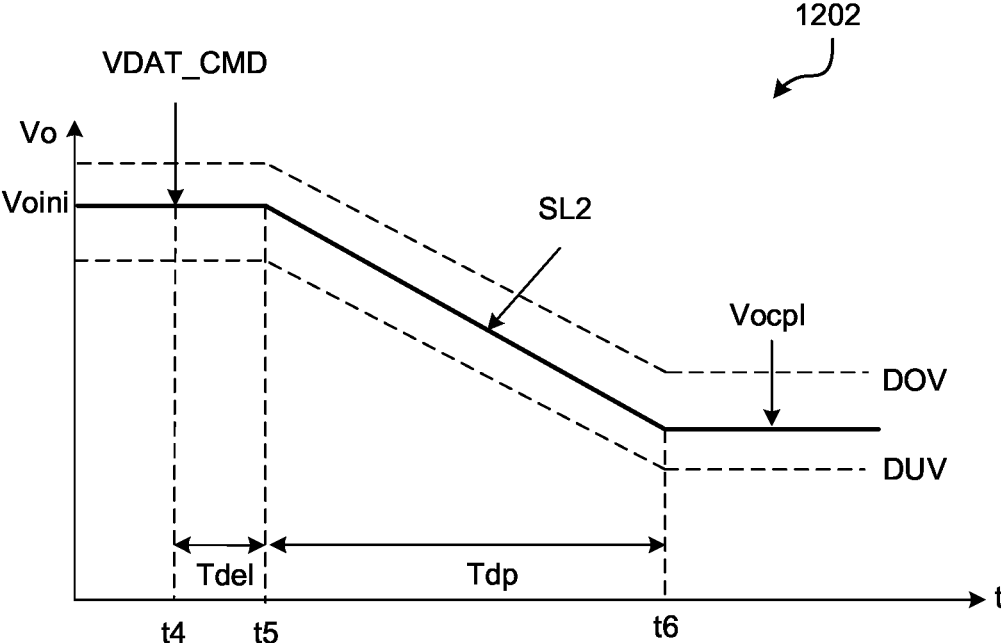
FIG. 11 illustrates a timing diagram 1202 during the voltage self-test in accordance with another embodiment of the present invention.

FIG. 11 illustrates a timing diagram 1202 during the voltage self-test in accordance with another embodiment of the present invention. In one embodiment, before time t4, the falling slew rate SL2 of output voltage Vo during the voltage self-test, the initial output voltage Voini at the beginning of the voltage self-test, and the final output voltage Vocpl at the end of the voltage self-test are configured by the programmable control circuit 14 based on the voltage test data DVAT. At time t4, the programmable control circuit 14 sends the command VDAT_CMD to to initiate the voltage self-test, the reference voltage Vref varies based on the voltage test data VDAT. At time t5, the voltage regulator responds to the command VDAT_CMD, and the output voltage Vo begins to change based on the voltage test data VDAT. For example, the output voltage Vo decreases from the initial output voltage Voini to the final output voltage Vocpl with the falling slew rate SL2. At time t6, the output voltage Vo reaches the final output voltage Vocpl, and the voltage self-test is finished. During the voltage self-test, the programmable control circuit 14 monitors whether the output voltage Vo exceeds the preset ranges, e.g., the overvoltage tolerance band DOV and the undervoltage tolerance band DUV. In one embodiment, the delay time period Tdel of the output voltage Vo responding to variation of the reference voltage Vref is monitored by the programmable control circuit 14, e.g, monitoring a time period from time t4 that the voltage self-test starts to time t5 that the output voltage Vo begins to change. In one embodiment, the duration Tdp of the output voltage Vo responding to variation of the reference voltage Vref is monitored by the programmable control circuit 14, e.g., monitoring a time period from time t5 to time t6 when the output voltage Vo reaches the final output voltage Vocpl. In one embodiment, the programmable control circuit 14 or the system controller 20 determines whether the voltage regulator is likely to be damaged based on the above parameters monitored during the voltage self-test.

FIG. 12 illustrates a current self-test method 130 in accordance with an embodiment of the present invention.

The current self-test method 130 has steps S31-S34. One with ordinary skill in the art should understand that the current self-test method is not limited to the specific embodiment shown in FIG. 12.

At the step S31, configuring the operating parameters related with the output current Io by the programmable control circuit 14 based on the current test data IDAT. The operating parameters related with the output current Io may comprise at least two of the rising slew rate SL3 of the output current Io, the falling slew rate SL4 of the output current Io, the initial output current Ioini, the final output current Iocpl, the number of times Inum that the output current Io changes bewteen the initial output current Ioini and the final output current Iocpl, the duration Tdp2 during which the output current Io remains at the initial output current Ioini in one transition cycle, and the duration Tdp3 during which the output current Io remains at the final output current Iocpl in one transition cycle.

At the step S32, generating a command by the programmable control circuit 14 to change the output current Io based on the current test data IDAT. For example, the current exhausting circuit is controlled to change the output current Io based on the current test data IDAT.

At the step S33, monitoring the current self-test based on the parameter feedback data DFB, such as monitoring one or more of whether the output voltage Vo after stabilized exceeds the preset ranges, e.g., the overvoltage tolerance band DOV and the undervoltage tolerance band DUV, an overshoot value VOS of the output voltage Vo, and an undershoot value VUS of the output voltage Vo. In one embodiment, The preset ranges may vary with the output current Io in real time. For example, when the output voltage Vo decreases with increasing of the output current Io, the overvoltage tolerance band DOV and the undervoltage tolerance band DUV move down.

At the step S34, judging if the voltage regulator is likely to be damaged based on the monitoring results at the step S33. In one embodiment, the possibility of damage of the voltage regulator is judged by the programmable control circuit 14. In another embodiment, the monitoring results are send to the system controller 20, and the possibility of damage of the voltage regulator is judged by the system controller 20.

Figure 13:
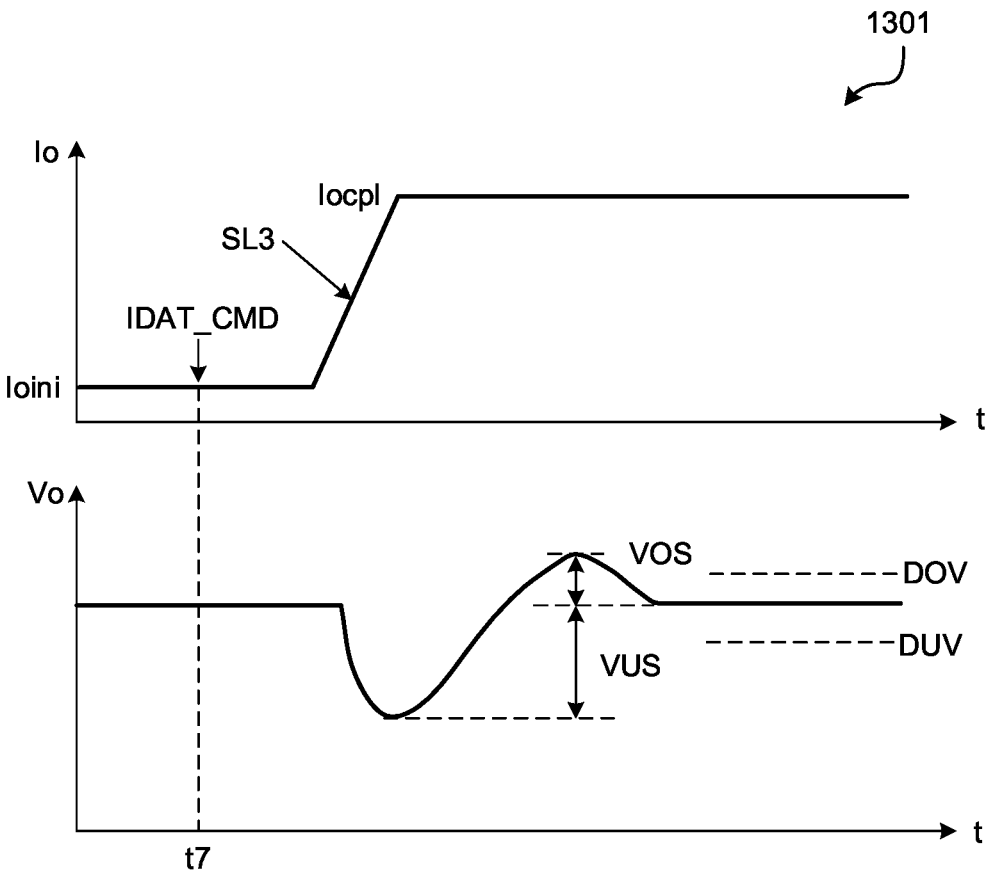
FIG. 13 illustrates a timing diagram 1301 during the current self-test in accordance with an embodiment of the present invention.

FIG. 13 illustrates a timing diagram 1301 during the current self-test in accordance with an embodiment of the present invention. In one embodiment, before time t7, the rising slew rate SL3 of the output current Io during the current self-test, the initial output current Ioini at the beginning of the current self-test, and the final output current Iocpl at the end of the current self-test are configured by the programmable control circuit 14 based on the current test data IDAT. At time t7, the programmable control circuit 14 sends a command IDAT_CMD to initiate the current self-test, and the output current Io will vary based on the current test data IDAT, such as increasing from the initial output current Ioini to the final output current Iocpl with the rising slew rate SL3. The programmable control circuit 14 monitors whether the output voltage Vo after stabilized exceeds the overvoltage tolerance band DOV and the undervoltage tolerance band DUV, and monitors the overshoot value VOS and the undershoot value VUS of the output voltage Vo. In one embodiment, the programmable control circuit 14 or the system controller determines whether the voltage regulator is likely to be damaged based on the above parameters monitored during the current self-test.

Figure 14:
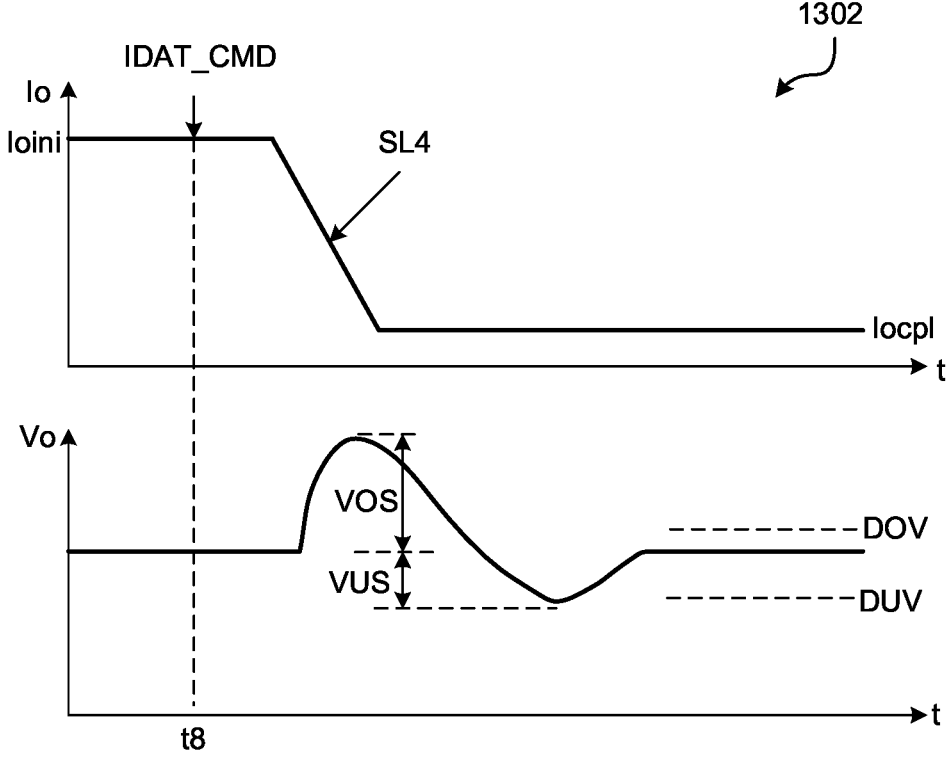
FIG. 14 illustrates a timing diagram 1302 during the current self-test in accordance with another embodiment of the present invention.

FIG. 14 illustrates a timing diagram 1302 during the current self-test in accordance with another embodiment of the present invention. In one embodiment, before time t8, the falling slew rate SL4 of output current Io during the current self-test, the initial output current Ioini at the beginning of the current self-test, and the final output current Iocpl at the end of the current self-test are configured by the programmable control circuit 14 based on the current test data IDAT. At time t8, the programmable control circuit 14 sends the command IDAT_CMD to initiate the current self-test, and the output current Io will vary according to the current test data IDAT, such as decreasing from the initial output current Ioini to the final output current Iocpl with the falling slew rate SL4. The programmable control circuit 14 monitors whether the output voltage Vo after stabilized exceeds the overvoltage tolerance band DOV and the undervoltage tolerance band DUV, and monitors the overshoot value VOS and the undershoot value VUS of the output voltage Vo. In one embodiment, the programmable control circuit 14 or the system controller determines whether the voltage regulator is likely to be damaged based on the above parameters monitored during the current self-test.

Figure 15:
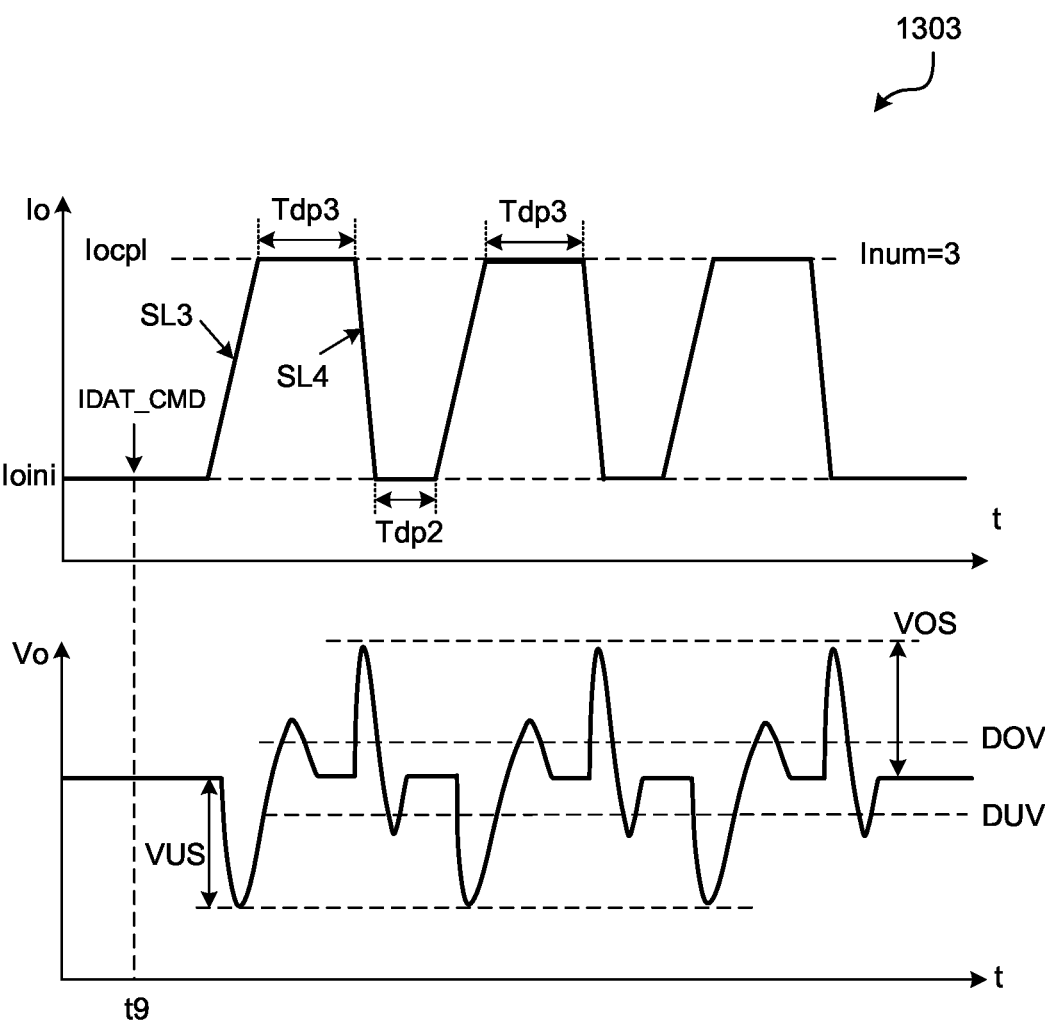
FIG. 15 illustrates a timing diagram 1303 during the current self-test in accordance with another embodiment of the present invention.

FIG. 15 illustrates a timing diagram 1303 during the current self-test in accordance with another embodiment of the present invention. In one embodiment, before time t9, the rising slew rate SL3 of the output current Io, the falling slew rate SL4 of the output current Io, the initial output current Ioini, the final output current Iocpl, the number of times Inum that the output current Io changes bewteen the initial output current Ioini and the final output current Iocpl during the current self-test, the duration Tdp2 during which the output current Io remains at the initial output current Ioini in one transition cycle, and the duration Tdp3 during which the output current Io remains at the final output current Iocpl in one transition cycle are configured by the programmable control circuit 14 based on the current test data IDAT. At time t9, the programmable control circuit 14 sends the command IDAT_CMD to initiate the current self-test, and the output current Io will vary based on the current test data IDAT, e.g., transiting between the initial output current Ioini and the final output current Iocpl as shown in FIG. 15. The programmable control circuit 14 monitors whether the output voltage Vo after stabilized exceeds the overvoltage tolerance band DOV and the undervoltage tolerance band DUV during the current self-test, and monitors the overshoot value VOS and the undershoot value VUS of the output voltage Vo. In one embodiment, it is not necessary to monitor whether the output voltage Vo exceeds the overvoltage tolerance band DOV or the undervoltage tolerance band DUV until it stabilizes. In one embodiment, the programmable control circuit 14 or the system controller determines whether the voltage regulator is likely to be damaged based on the above parameters monitored during the current self-test.

Figure 16:
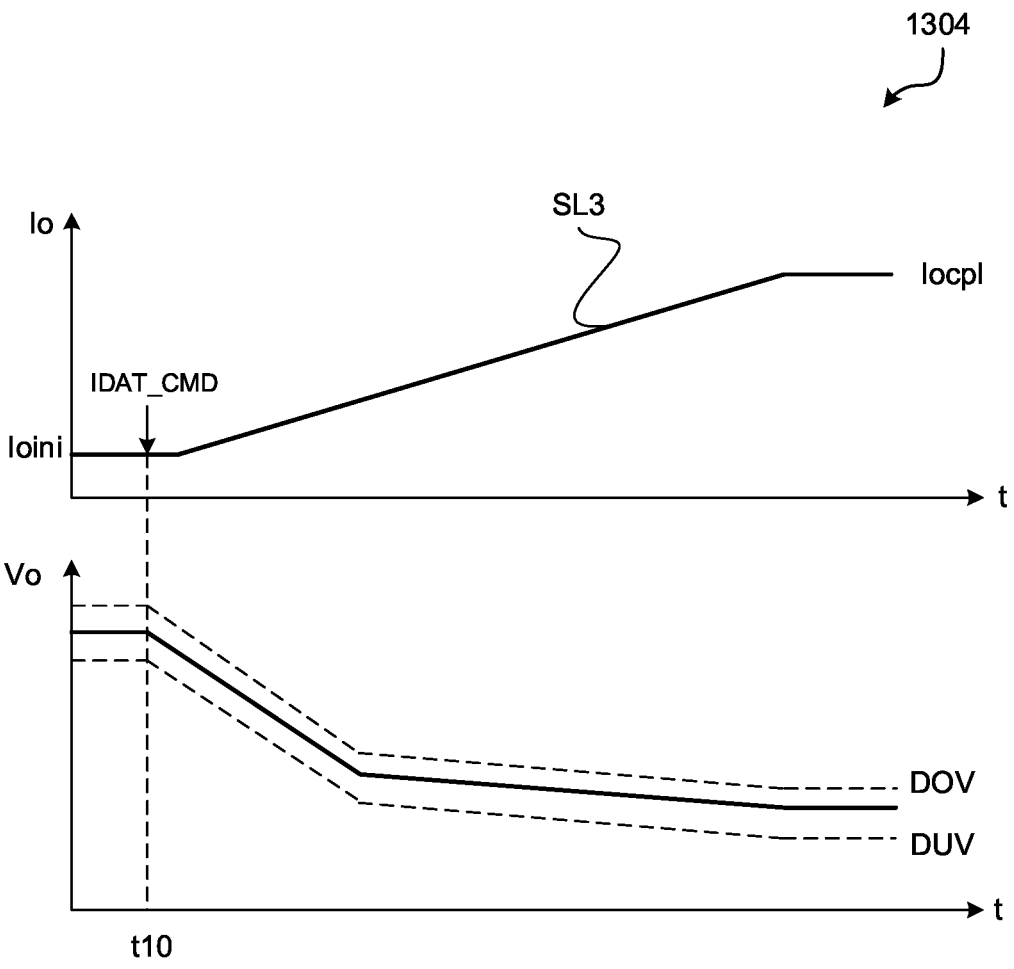
FIG. 16 illustrates a timing diagram 1304 during the current self-test in accordance with another embodiment of the present invention.

FIG. 16 illustrates a timing diagram 1304 during the current self-test in accordance with another embodiment of the present invention. In one embodiment, before time t10, the rising slew rate SL3 of the output current Io during the current self-test, the initial output current Ioini at the beginning of the current self-test, and the final output current Iocpl at the end of the current self-test are configured by the programmable control circuit 14 based on the current test data IDAT. At time t10, the programmable control circuit 14 sends a command IDAT_CMD to initiate the current self-test, and the output current Io will vary based on the current test data IDAT, such as increasing from the initial output current Ioini to the final output current Iocpl with the rising slew rate SL3 as shown in FIG. 16. In the embodiment shown in FIG. 16, the load line control signal LL controls the output voltage Vo varying nonlinearly with the output current Io, such as the output voltage Vo has different slew rate within different output current Io range. One with ordinary skill in the art should understand that the curve of output voltage Vo versus output current Io is not limited to the embodiment shown in FIG. 16. For example, the output voltage Vo may vary linearly with the variation of output current Io, or have different slew rate from the embodiment shown in FIG. 16. The programmable control circuit 14 monitors the output voltage Vo and output current Io during the current self-test via the parameter feedback data DFB. For example, to monitor whether the output voltage Vo exceeds the overvoltage tolerance band DOV and the undervoltage tolerance band DUV, wherein the overvoltage tolerance band DOV and the undervoltage tolerance band DUV are changing with the output current Io in real time. Another example is to monitor whether output current Io and output voltage Vo are correspond to each other. The programmable control circuit 14 or the system controller determines whether there is a possibility of damage to the voltage regulator based on the above parameters monitored during the current self-test.

FIG. 17 illustrates a parameter self-test method 140 in accordance with an embodiment of the present invention. The parameter self-test method 140 has steps S41-S44. One with ordinary skill in the art should understand that the parameter self-test method is not limited to the specific embodiment shown in FIG. 17.

At the step S41, configuring operating parameters or commands of the voltage regulator by the the programmable control circuit 14 based on the load protocol packets simulated by the parameter test data TDAT. For example, configuring the load line control signal LL and the offset of the output voltage Vo, or restarting the voltage regulator based on the parameter test data TDAT.

At the step S42, operating the voltage regulator according to the operating parameters or commands configured by the parameter test data TDAT.

At the step S43, monitoring the parameter self-test based on the parameter feedback data DFB, such as monitoring at least one of the output voltage Vo and output current Io to monitor the load line, the offset of the output voltage, or restart of the voltage regulator.

At the step S44, judging if the voltage regulator is likely to be damaged based on the monitoring results at the step S43. In one embodiment, the possibility of damage of the voltage regulator is judged by the programmable control circuit 14. In another embodiment, the monitoring results are send to the system controller 20, and the possibility of damage of the voltage regulator is judged by the system controller 20. In one embodiment, if the programmable control circuit 14 does not respond to the simulated load protocol packets, then the communication between the voltage regulator and the load is potentially corrupted.

FIG. 18 illustrates a parameter self-test method 150 in accordance with another embodiment of the present invention. The parameter self-test method 150 has steps S51-S54. One with ordinary skill in the art should understand that the parameter self-test method is not limited to the specific embodiment shown in FIG. 18.

At the step S51, modifying the operating parameters according to the load power states simulated by the parameter test data TDAT, such as modifying one or more of the initial phase number Pn1 put into operation at the beginning of the parameter self-test, the initial current mode Mode1 at the beginning of the parameter self-test, the final phase number Pn2 put into operation at the end of the parameter self-test, and the final current mode Mode2 at the end of the parameter self-test.

At the step S52, operating the voltage regulator according to the operating parameters modified by the parameter test data TDAT.

At the step S53, monitoring the parameter self-test based on the parameter feedback data DFB, such as monitoring at least one of the output voltage Vo and output current Io to monitor at least two of an initial reaction time Tini1, an end reaction time Tcpl1, the phase number put into operation, the current mode of the voltage regulator, and the output voltage Vo versus the preset ranges.

At the step S54, judging if the voltage regulator is likely to be damaged based on the monitoring results. In one embodiment, the possibility of damage of the voltage regulator is judged by the programmable control circuit 14. In another embodiment, the monitoring results are send to the system controller 20, and the possibility of damage of the voltage regulator is judged by the system controller 20. In one embodiment, if the programmable control circuit 14 does not respond to the simulated load power states, then the communication between the voltage regulator and the load is potentially corrupted, or the power stage of the voltage regulator may be damaged.

FIG. 19 illustrates a control method 600 for a voltage regulator in accordance with an embodiment of the present invention. The control method 600 comprises steps S61-S67.

At the step S61, receiving a voltage feedback signal representing the output voltage of the voltage regulator. At the step S62, receiving a current feedback signal representing an output current of the voltage regulator. At the step S63, providing a parameter feedback data based on the voltage feedback signal and the current feedback signal.

At the step S64, storing the parameter feedback data and a test configuration data. In one embodiment, the test configuration data is used to simulate the load requirements for the output voltage and the transition slew rate of the output voltage. In one embodiment, the test configuration data is used to simulate the load requirements for the output current. In one embodiment, the test configuration data is used to simulate the load protocol packets or power states issued by the load.

At the step S65, providing the switching control signal to turn on and turn off at least one switch of the voltage regulator based on the voltage feedback signal and a reference voltage.

At the step S66, configuring operating parameters of the voltage regulator based on the test configuration data to perform a self-test. In one embodiment, the operating parameters of the voltage regulator configured based on the test configuration data comprise the slew rate of the output voltage varied during the self-test (e.g., the rising slew rate and/or the falling slew rate of the output), and the final output voltage and the end of the self-test. In one embodiment, the operating parameters of the voltage regulator configured based on the test configuration data comprise the slew rate of the output current varied during the self-test (e.g., the rising slew rate and/or the falling slew rate), the initial output current, and the final output current. In one embodiment, the operating parameters of the voltage regulator configured based on the test configuration data comprise the slew rate of the output current varied during the self-test (e.g., the rising slew rate and/or the falling slew rate), the initial output current, the final output current, a number of times that the output current transits bewteen the initial output current and the final output current during the self-test, a duration that the output current remains at the initial output current in one transition cycle, and a duration that the output current remains at the final output current in one transition cycle. In one embodiment, the operating parameters of the voltage regulator configured based on the test configuration data comprise a load line control signal, an offset of the output voltage, and/or a command to restart he voltage regulator. In one embodiment, the operating parameters of the voltage regulator configured based on the test configuration data comprise comprise an initial phase number put into operation, an initial current mode, a final phase number put into operation, and/or a final current mode.

At the step S67, determining if the voltage regulator is likely to be damaged based on the parameter feedback data.

In one embodiment, the control method 600 further comprises controlling a current exhausting circuit based on the test configuration data to vary the output current of the voltage regulator.

Note that in the flow chart described above, the box functions may also be implemented with different order as shown in FIG. 19. Two successive box functions may be executed meanwhile, or sometimes the box functions may be executed in a reverse order.

FIG. 20 illustrates a control method 700 for the voltage regulator in accordance with another embodiment of the present invention. The control method 700 has steps S71-S76.

At the step S71, receiving the voltage feedback signal representing the output voltage of the voltage regulator. At the step S72, providing the parameter feedback data based on the voltage feedback signal. At the step S73, storing the parameter feedback data and a status data. At the step S74, providing the switching control signal to turn on and turn off at least one switch of the voltage regulator based on the voltage feedback signal and the reference voltage. At the step S75, controlling the current exhausting circuit via a current control pin to change the output current of the voltage regulator. At the step S76, determining if the voltage regulator is likely to be damaged based on the parameter feedback data.

In one embodiment, the control method 700 further comprises receiving a current feedback signal representing the output current of the voltage regulator and providing the parameter feedback data further based on the current feedback signal.

Note that in the flow chart described above, the box functions may also be implemented with different order as shown in FIG. 20. Two successive box functions may be executed meanwhile, or sometimes the box functions may be executed in a reverse order.

Figure 21:
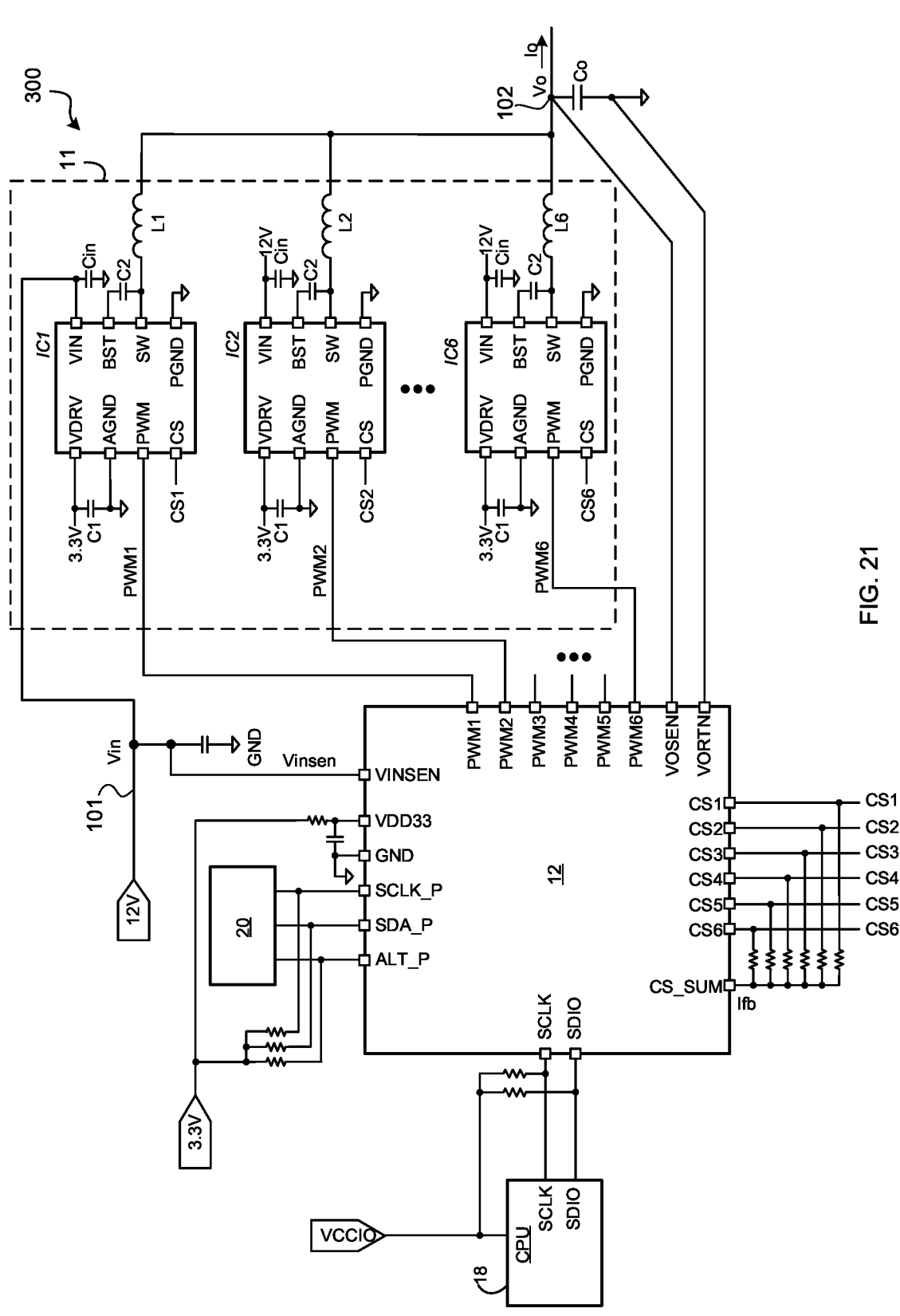
FIG. 21 schematically illustrates a voltage regulator 300 in accordance with an embodiment of the present invention.

FIG. 21 schematically illustrates a voltage regulator 300 in accordance with an embodiment of the present invention. The voltage regulator 300 comprises the control IC 12 and the power stage 11. In the embodiment shown in FIG. 21, the power stage 11 comprises a 6-phase switching circuit, each phase switching circuit has a power IC ICi and an inductor Li (i=1, 2 . . . 6), e.g., a power IC IC1 and an inductor L1 forms the first phase switching circuit, a power IC IC2 and an inductor L2 forms the second phase switching circuit, and so on.

Each power IC comprises a voltage input pin VIN coupled to the input terminal 101 to receive the input voltage Vin, a switching pin SW, a bootstrap pin BST, a logic power supply pin VDRV configured to receive a logic input voltage, a power ground pin PGND coupled to a power ground, a signal ground pin AGND coupled to a signal ground, a current sensing output pin CS, and a switching control input pin PWM. In one embodiment, the power ground and the signal ground are coupled together on the PCB to form the reference ground GND. In the embodiment shown in FIG. 21, the input voltage Vin is 12V and the logic input voltage is 3.3V. A capacitor C1 is coupled between the logic power supply pin VDRV and the signal ground pin AGND, a capacitor C2 is coupled between the bootstrap pin BST and the switching pin SW, and a capacitor Cin is coupled between the voltage input pin VIN and the reference ground GND. The switching control input pin PWM receives a corresponding switching control signal PWMi, and the current sensing output pin CS provides a corresponding current feedback signal Csi, which represents a current flowing through the corresponding power IC. The switching pin SW is coupled to the inductor Li to provide the output voltage Vo. That is, one terminal of the inductor Li is coupled to the switching pin SW of the power IC ICi, and the other terminal of of the inductor Li is coupled to the output terminal 102 to provide the output voltage Vo. The output capacitor Co is coupled between the output terminal 102 and the reference ground GND.

The control IC 12 comprises the switching control pins PWM1~PWM6 to provide switching control signals PWM1~PWM6, the phase current feedback pins CS1-CS6 to receive current feedback signals CS1~CS6, a total current feedback pin CS_SUM to receive the current feedback signal Ifb, an input voltage feedback pin VINSEN, a remote voltage feedback pin VOSEN, and a remote voltage return pin VORTN. The input voltage feedback pin VINSEN receives an input voltage feedback signal Vinsen, which represents the input voltage Vin. The remote voltage feedback pin VOSEN is coupled to one terminal of the output capacitor Co and the remote voltage return pin VORTN is coupled to the other terminal of the output capacitor Co. A voltage between the remote voltage feedback pin VOSEN and the remote voltage feedback return pin VORTN represents the voltage feedback signal Vfb. In one example, the control IC 12 further comprises communication pins SCLK, SDIO that can be coupled to the processor load 18 (e.g., the CPU as shown in FIG. 21) through SVID bus (e.g., having a clock bus and a data bus). In the embodiment shown in FIG. 21, the communication pin SCLK is coupled to the clock bus and the communication pin SDIO is coupled to the data bus. In one example, the control IC 12 further comprises communication pins SCLK_P, SDA_P, and ALT_P that can be coupled to the system controller 20 through a PMBus (e.g., having a clock bus, a data bus, and an alarm bus). In the embodiment shown in FIG. 21, the communication pin SCLK_P is coupled to the clock bus, the communication pin SDA_P is coupled to the data bus, and the communication pin ALT_P is coupled to the alarm bus. In one embodiment, the control IC 12 further comprises a logic supply pin VDD33, coupled to 3.3V voltage.

Figure 22:
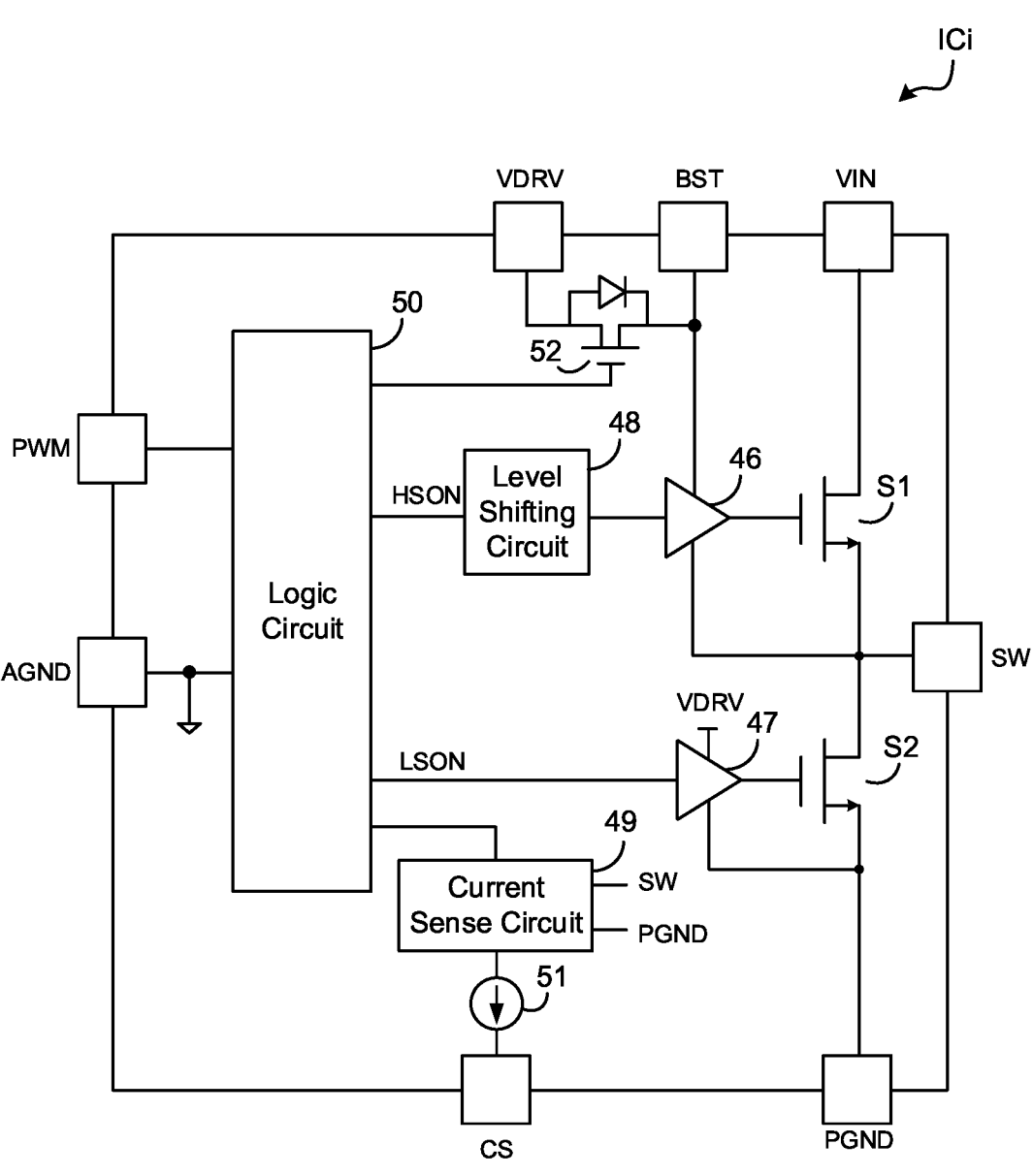
FIG. 22 schematically illustrates a power integrated circuit (IC) ICi in accordance with an embodiment of the present invention.

FIG. 22 schematically illustrates a power integrated circuit (IC) ICi in accordance with an embodiment of the present invention. As shown in FIG. 22, the power IC ICi comprises the high-side switch S1 and the low-side switch S2. A first terminal of the high-side switch S1 is coupled to the voltage input pin VIN, a second terminal of the high-side switch S1 is coupled to the switching pin SW, and a control terminal of the high-side switch S1 is coupled to an output terminal of a driving circuit 46. A first terminal of the low-side switch S2 is coupled to the second terminal of the high-side switch S1 and the switching pin SW, a second terminal of the low-side switch S2 is coupled to the power ground pin PGND, and a control terminal of the low-side switch S2 is coupled to an output terminal of a driving circuit 47. The bootstrap pin BST is coupled to the logic power supply pin VDRV via a switch 52. A logic circuit 50 is coupled to the switching control input pin PWM and the signal ground pin AGND, and generates a high-side control signal HSON and a low-side control signal LSON. After level shift conducted by a lever shifting circuit 48, the high-side control signal HSON controls the high-side switch S1 through the driving circuit 46, and the low-side control signal LSON controls the low-side switch S2 through the driving circuit 47. The current sense circuit 49 senses the current flowing through the high-side switch S1 or the low-side switch S2, and provides a current sensing signal at the current sensing output pin CS. In one embodiment, the current sensing signal is a current signal generated by a current source 51.

Figure 23:
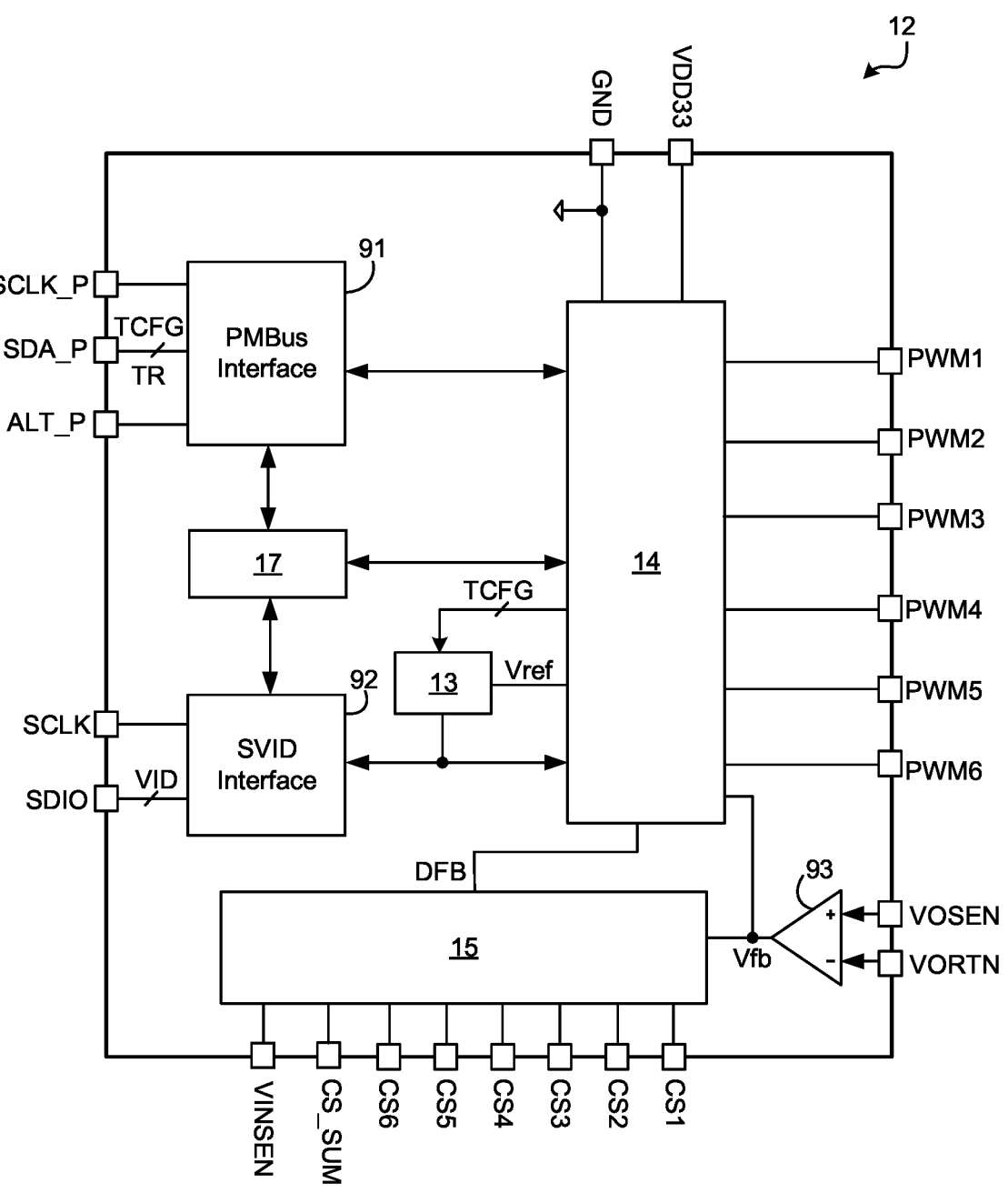
FIG. 23 schematically illustrates a control IC 12 in accordance with an embodiment of the present invention.

FIG. 23 schematically illustrates a control IC 12 in accordance with an embodiment of the present invention. In the embodiment shown in FIG. 23, the programmable control circuit 14 provides the switching control signals PWM1-PWM6 through the switching control pins PWM1-PWM6. In one embodiment, the control IC 12 comprises a differential amplifier 93. The differential amplifier 93 has a first terminal coupled to the remote voltage feedback pin VOSEN, and a second terminal coupled to the remote voltage return pin VORTN, and an output terminal configured to provide the voltage feedback signal Vfb. In one embodiment, the information acquisition circuit 15 generates the parameter feedback data DFB based on the voltage feedback signal Vfb, the current feedback signal Ifb, the input voltage feedback signal Vinsen, and the current feedback signals CS1-CS6, e.g., via an analog-to-digital conversion. In the embodiment shown in FIG. 23, the control IC 12 further comprises a PMBus interface 91 coupled to the communication pins SCLK_P, SDA_P, and ALT_P, and a SVID interface 92 coupled to the communication pin SCLK and SDIO. In one embodiment, the PMBus interface 91 is coupled to the storage circuit 17 and/or the programmable control circuit 14. In one embodiment, the SVID interface circuit 92 is coupled to the storage circuit 17 and/or the programmable control circuit 14. The storage circuit 17 may be coupled to the programmable control circuit 14 for bidirectional data transmission.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

I claim:

1. A control integrated circuit (IC) for a voltage regulator, comprising:

a first feedback pin configured to receive a voltage feedback signal representative of an output voltage of the voltage regulator;

a second feedback pin configured to receive a current feedback signal representative of an output current of the voltage regulator;

an information acquisition circuit configured to provide a parameter feedback data based on the voltage feedback signal and the current feedback signal;

a switching control pin configured to provide a switching control signal to turn on and turn off at least one switch of the voltage regulator;

a first communication pin configured to receive a voltage identification code used for setting the output voltage;

a storage circuit configured to store the parameter feedback data and a test configuration data;

a reference generating circuit configured to provide a reference voltage based on one of the voltage identification code and the test configuration data; and a programmable control circuit configured to provide the switching control signal based on the voltage feedback signal and the reference voltage, and configured to perform a self-test of the voltage regulator based on the test configuration data; wherein during the self-test, the programmable control circuit is configured to set operating parameters of the voltage regulator based on the test configuration data, and the programmable control circuit is further configured to determine if the voltage regulator is likely to be damaged based on the parameter feedback data.

2. The control IC of claim 1, further comprising:

a second communication pin configured to receive the test configuration data.

3. The control IC of claim 1, wherein:

a load of the voltage regulator is out of operation during the self-test; and when the self-test is complete and the control IC determines that the voltage regulator is able to work properly, the control IC transits into normal operation with the load being put into operation.

4. The control IC of claim 3, wherein during normal operation, the control IC is configured to receive the voltage identification code from the load via the first communication pin, and the reference generating circuit is configured to generate the reference voltage according to the voltage identification code.

5. The control IC of claim 1, wherein the reference generating circuit is configured to generate the reference voltage according to the test configuration data during the self-test.

6. The control IC of claim 1, wherein the programmable control circuit is configured to determine if the voltage regulator is likely to be damaged via monitoring whether the output voltage exceeds one or more preset ranges during the self-test based on the parameter feedback data, and wherein the one or more preset ranges vary with the reference voltage or the output current.

7. The control IC of claim 1, wherein:

the test configuration data is configured to be used by the programmable control circuit to perform at least one of a voltage self-test, a current self-test, and a parameter self-test;

during the voltage self-test, the test configuration data is configured to set the operating parameters related with the output voltage via simulating power supply requirements issued by the load;

during the current self-test, the test configuration data is configured to set the operating parameters related with the output current via simulating the power supply requirements issued by the load; and during the parameter self-test, the test configuration data is configured to set the operating parameters via simulating load protocol packets or power states issued by the load.

8. The control IC of claim 1, wherein the operating parameters set by the test configuration data during the self-test comprise a slew rate of the output voltage, and a target of the output voltage at the end of the self-test.

9. The control IC of claim 1, wherein the operating parameters set by the test configuration data during the self-test comprise a slew rate of the output current, an initial output current, and a final output current.

10. The control IC of claim 9, wherein the operating parameters set by the test configuration data further comprise a number of times that the output current changes between the initial output current and the final output current, a first duration during which the output current remains at the initial output current, and a second duration during which the output current remains at the final output current.

11. The control IC of claim 1, further comprising:
a current control pin configured to be coupled to a current exhausting circuit, wherein the current exhausting circuit is controlled by the test configuration data to change the output current of the voltage regulator during the self-test.

12. The control IC of claim 1, wherein:
the programmable control circuit is configured to provide a status data to indicate if the voltage regulator is likely to be damaged; and wherein
the storage circuit is configured to store the status data.

13. The control IC of claim 12, further comprising:
a second communication pin configured to receive the test configuration data and output the status data.

14. The control IC of claim 12, wherein the programmable control circuit comprises:
a switching control unit configured to provide the switching control signal based on the voltage feedback signal and the reference voltage; and
an operating unit configured to provide the status data by comparing the parameter feedback data with one or more preset ranges set by the test configuration data.

15. A control integrated circuit (IC) for a voltage regulator, comprising:
a first feedback pin configured to receive a voltage feedback signal representative of an output voltage of the voltage regulator;
an information acquisition circuit configured to provide a parameter feedback data based on the voltage feedback signal;
a switching control pin configured to provide a switching control signal to turn on and turn off at least one switch of the voltage regulator;
a storage circuit configured to store the parameter feedback data and a status data;
a communication pin coupled to the storage circuit;
a current control pin configured to be coupled to a current exhausting circuit; and
a programmable control circuit configured to provide the switching control signal based on the voltage feedback signal and a reference voltage, configured to control the current exhausting circuit via the current control pin to set operating parameters related with an output current of the voltage regulator during a self-test, and configured to determine if the voltage regulator is likely to be damaged based on the parameter feedback data and provide the status data accordingly.

16. The control IC of claim 15, wherein the programmable control circuit is configured to control the current exhausting circuit based on a test configuration data received from the communication pin.

17. The control IC of claim 15, wherein:
a load of the voltage regulator is out of operation during the self-test; and
when the self-test is complete and the control IC determines that the voltage regulator is able to work properly, the control IC transits into normal operation with the load being put into operation.

18. The control IC of claim 15, wherein the operating parameters related with the output current controlled by the current exhausting circuit during the self-test comprises:
(a) a rising slew rate of the output current, an initial output current at the beginning of the self-test, and a final output current at the end of the self-test; or
(b) a falling slew rate of the output current, the initial output current at the beginning of the self-test, and the final output current at the end of self-test; or
(c) the rising slew rate of the output current, the falling slew rate of the output current, the initial output current, the final output current, a number of times that the output current changes between the initial output current and the final output current, a first duration during which the output current remains at the initial output current, and a second duration during which the output current remains at the final output current.

19. The control IC of claim 15, wherein the programmable control circuit is further configured to determine if the voltage regulator is likely to be damaged via monitoring whether the output voltage exceeds one or more preset ranges, be higher than an overshoot value, and be lower than an undershoot value based on the parameter feedback data during the self-test.

20. A control integrated circuit (IC) for a voltage regulator, comprising:
a feedback pin configured to receive a voltage feedback signal representative of an output voltage of the voltage regulator;
a switching control pin configured to provide a switching control signal to turn on and turn off at least one switch of the voltage regulator;
a current control pin configured to be coupled to a current exhausting circuit; and
a programmable control circuit configured to provide the switching control signal based on the voltage feedback signal and a reference voltage, configured to control the current exhausting circuit via the current control pin to change an output current of the voltage regulator, and configured to determine if the voltage regulator is likely to be damaged based on the voltage feedback signal during changing of the output current.

21. A control method for a voltage regulator, comprising:
receiving a voltage feedback signal representing an output voltage of the voltage regulator;
receiving a current feedback signal representing an output current of the voltage regulator;
providing a parameter feedback data based on the voltage feedback signal and the current feedback signal;
storing the parameter feedback data and a test configuration data in a storage circuit;
providing a switching control signal to turn on and turn off at least one switch of the voltage regulator based on the voltage feedback signal and a reference voltage;

configuring operating parameters of the voltage regulator based on the test configuration data to perform a self-test; and determining if the voltage regulator is likely to be damaged based on the parameter feedback data.

22. The control method of claim 21, wherein:

the test configuration data is configured to be used to perform at least one of a voltage self-test, a current self-test, and a parameter self-test;

during the voltage self-test, the test configuration data is configured to set the operating parameters related with the output voltage via simulating power supply requirements issued by a load of the voltage regulator;

during the current self-test, the test configuration data is configured to set the operating parameters related with the output current via simulating the power supply requirements issued by the load of the voltage regulator; and during the parameter self-test, the test configuration data is configured to set the operating parameters via simulating load protocol packets or power states issued by the load of the voltage regulator.

23. The control method of claim 21, wherein the operating parameters configured based on the test configuration data during the self-test comprises:

(a) a slew rate of the output voltage, and a target of the output voltage at the end of the self-test; or (b) a slew rate of the output current, an initial output current, and a final output current; or (c) the slew rate of the output current, the initial output current, the final output current, a number of times that the output current changes between the initial output current and the final output current, a first duration during which the output current remains at the initial output current, and a second duration during which the output current remains at the final output current.

24. The control method of claim 21, further comprising:

controlling a current exhausting circuit to set the operating parameters related with the output current during a self-test based on the test configuration data.

* * * * *